United States Patent
Kimura et al.

(10) Patent No.: US 9,576,967 B1
(45) Date of Patent: Feb. 21, 2017

(54) METHOD OF SUPPRESSING EPITAXIAL GROWTH IN SUPPORT OPENINGS AND THREE-DIMENSIONAL MEMORY DEVICE CONTAINING NON-EPITAXIAL SUPPORT PILLARS IN THE SUPPORT OPENINGS

(71) Applicant: SANDISK TECHNOLOGIES LLC, Plano, TX (US)

(72) Inventors: Hajime Kimura, Yokkaichi (JP); Seiji Shimabukuro, Yokkaichi (JP); Shuji Minagawa, Yokkaichi (JP); Michiaki Sano, Ichinomiya (JP); Masanori Tsutsumi, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/198,175

(22) Filed: Jun. 30, 2016

(51) Int. Cl.
*H01L 29/792* (2006.01)
*H01L 27/115* (2006.01)

(52) U.S. Cl.
CPC ..... *H01L 27/1157* (2013.01); *H01L 27/11517* (2013.01); *H01L 27/11565* (2013.01); *H01L 27/11582* (2013.01)

(58) Field of Classification Search
CPC ............ H01L 27/1157; H01L 27/11517; H01L 27/11582; H01L 27/11565; H01L 29/1033; H01L 27/11521; H01L 27/11524; H01L 27/11529; H01L 27/11531
See application file for complete search history.

(56) References Cited

U.S. PATENT DOCUMENTS

| | | | |
|---|---|---|---|
| 5,915,167 | A | 6/1999 | Leedy |
| 9,023,719 | B2 | 5/2015 | Pachamuthu et al. |
| 9,230,973 | B2 | 1/2016 | Pachamuthu et al. |
| 9,230,979 | B1 | 1/2016 | Pachamuthu et al. |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Thanh Y Tran
(74) *Attorney, Agent, or Firm* — The Marbury Law Group PLLC

(57) ABSTRACT

Memory openings and support openings are formed through an alternating stack of insulating layers and spacer material layers over a semiconductor substrate. Deposition of a semiconductor material in the support openings during formation of epitaxial channel portions in the memory openings is prevented by Portions of the semiconductor substrate that underlie the support openings are converted into impurity-doped semiconductor material portions. During selective growth of epitaxial channel portions from the semiconductor substrate within the memory openings, growth of a semiconductor material in the support openings is suppressed due to the impurity species in the impurity-doped semiconductor material portions. Memory stack structures and support pillar structures are subsequently formed over the epitaxial channel portions and in the support openings, respectively. The support pillar structures are formed with an outermost dielectric layer to prevent a leakage path to electrically conductive layers to be subsequently formed.

25 Claims, 26 Drawing Sheets

(56) References Cited

U.S. PATENT DOCUMENTS

| | | | |
|---|---|---|---|
| 9,230,987 B2 | 1/2016 | Pachamuthu et al. | |
| 9,397,046 B1* | 7/2016 | Sharangpani | H01L 27/11524 |
| 9,425,299 B1* | 8/2016 | Rabkin | H01L 29/7783 |
| 9,443,861 B1* | 9/2016 | Pachamuthu | H01L 27/11524 |
| 2016/0111439 A1* | 4/2016 | Tsutsumi | H01L 27/11582 |
| | | | 257/316 |
| 2016/0141294 A1* | 5/2016 | Peri | H01L 27/1157 |
| | | | 257/324 |

OTHER PUBLICATIONS

Wong, M. et al., "Wafer Temperature Dependence of the Vapor-Phase HF Oxide Etch," J. Electrochem., Soc., vol. 140, No. 1, pp. 205-208, (1993).

U.S. Appl. No. 14/314,274, filed Jun. 27, 2014, SanDisk Technologies Inc.

U.S. Appl. No. 14/341,079, filed Jul. 25, 2014, SanDisk Technologies Inc.

U.S. Appl. No. 14/643,280, filed Mar. 10, 2014, SanDisk Technologies Inc.

U.S. Appl. No. 14/927,708, filed Oct. 30, 2015, SanDisk Technologies Inc.

U.S. Appl. No. 14/927,990, filed Oct. 30, 2015, SanDisk Technologies Inc.

U.S. Appl. No. 14/989,206, filed Jan. 6, 2016, SanDisk Technologies Inc.

* cited by examiner

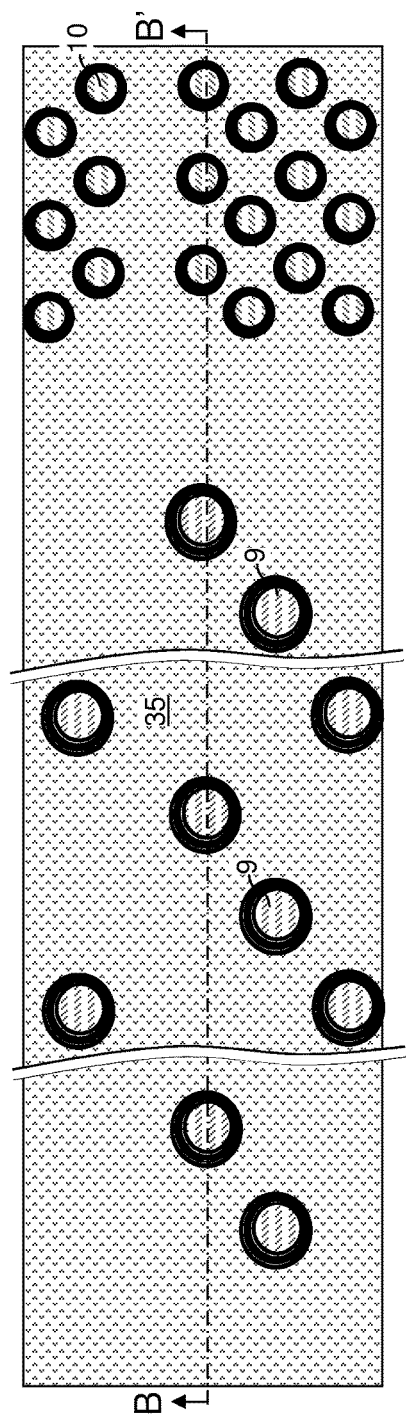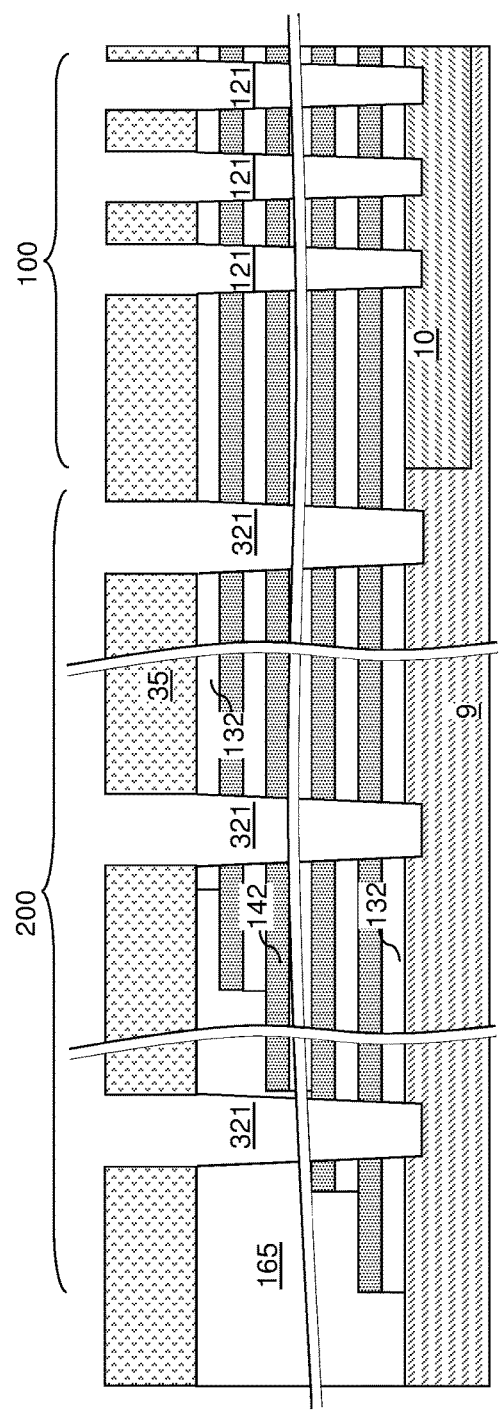

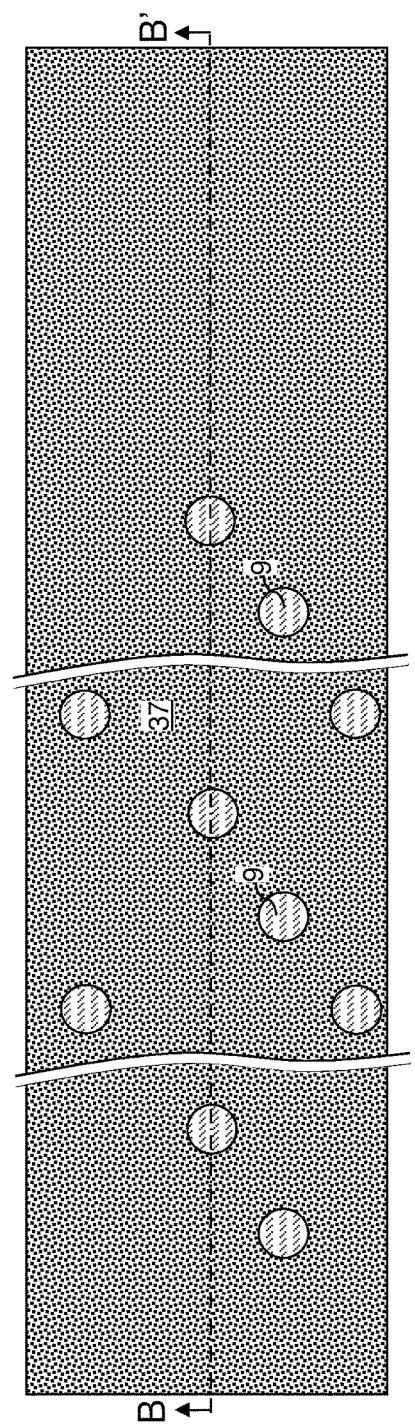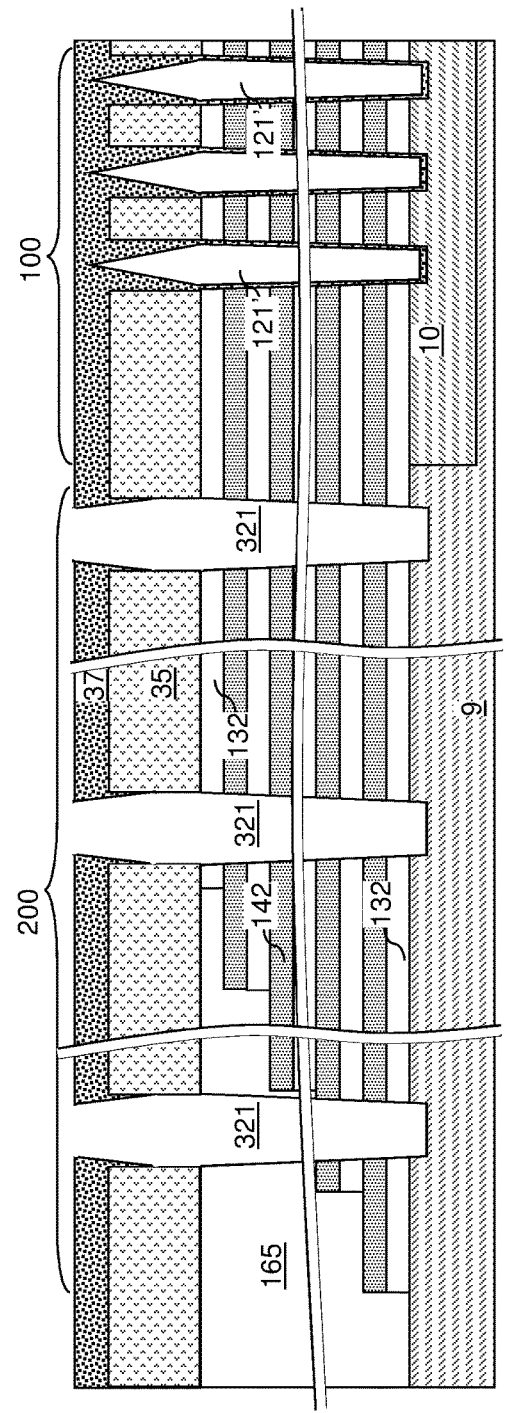
FIG. 5A
FIG. 5B

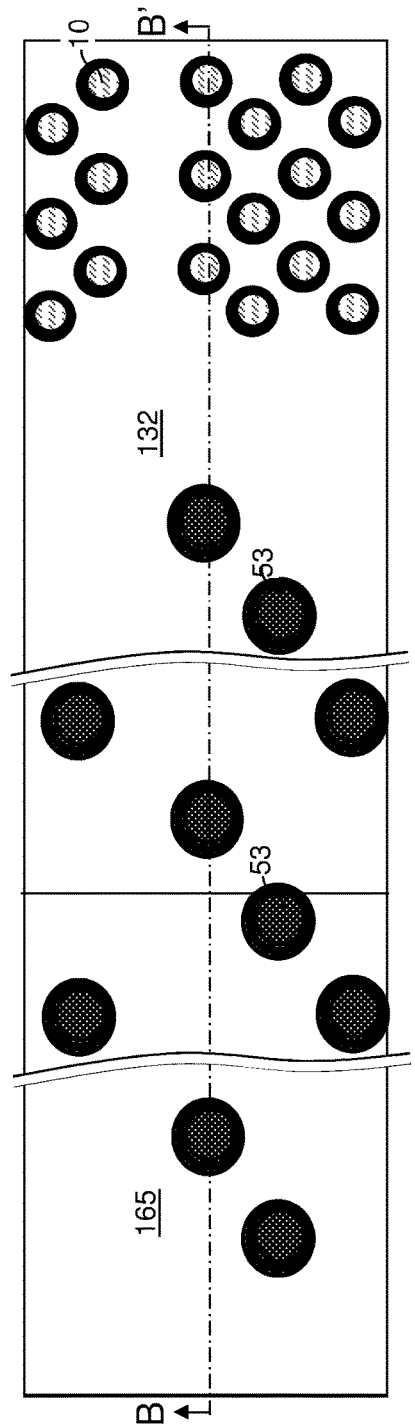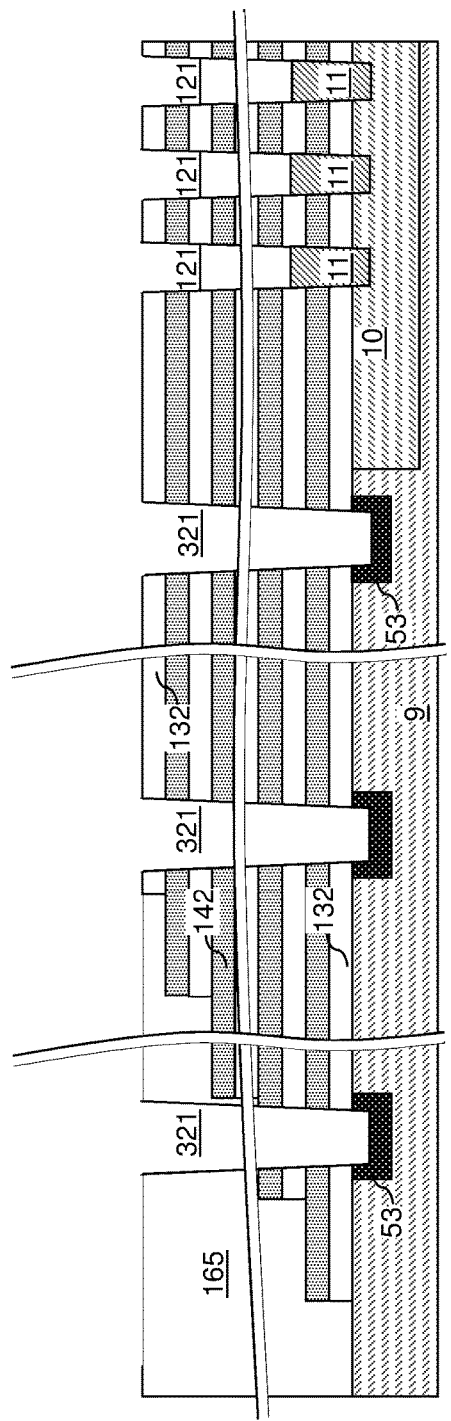

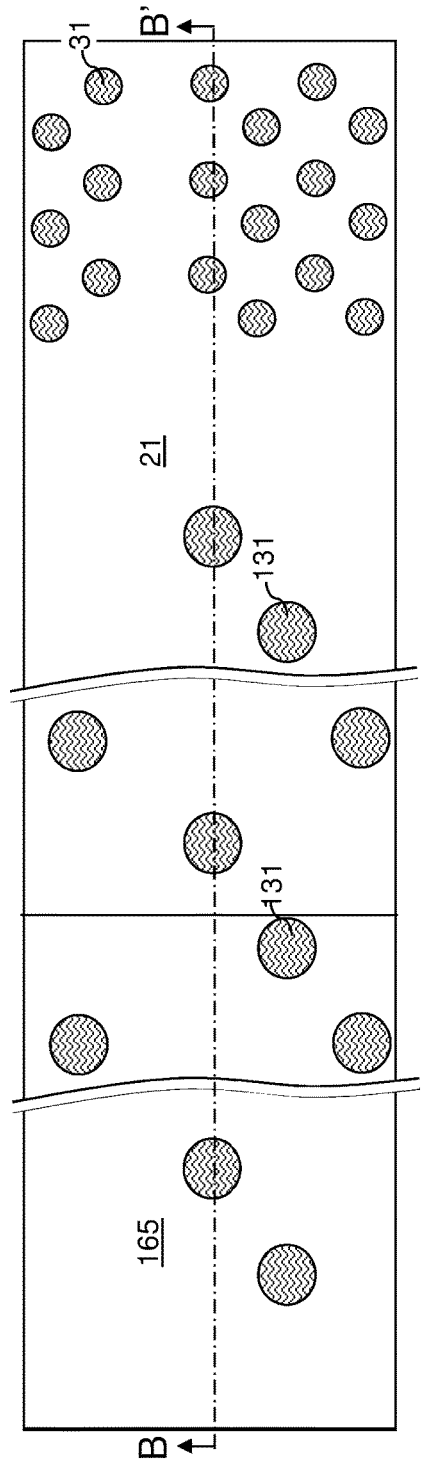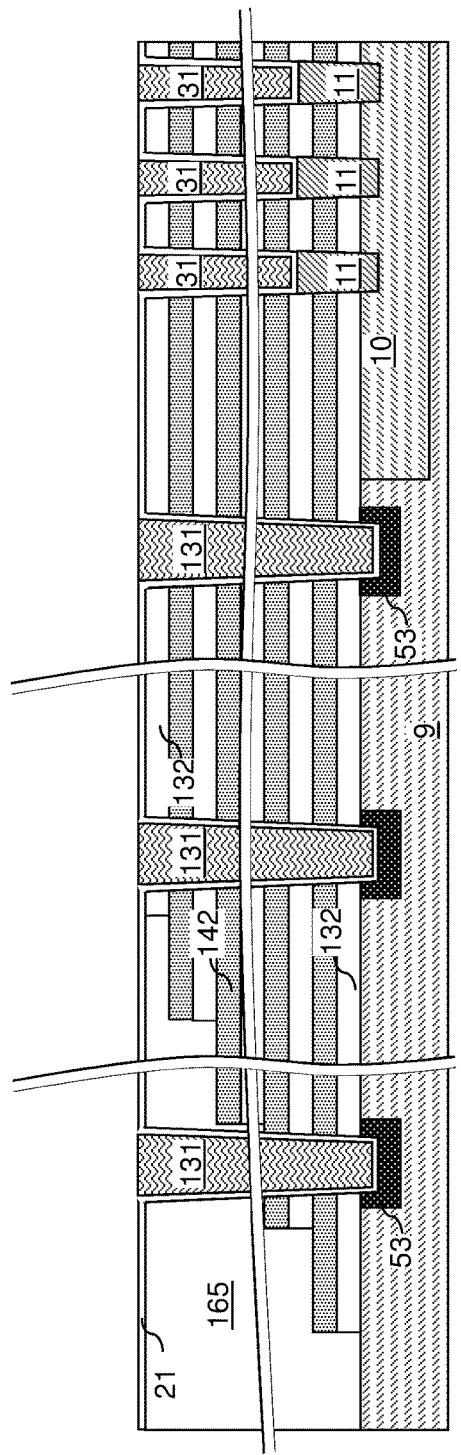
FIG. 9A
FIG. 9B

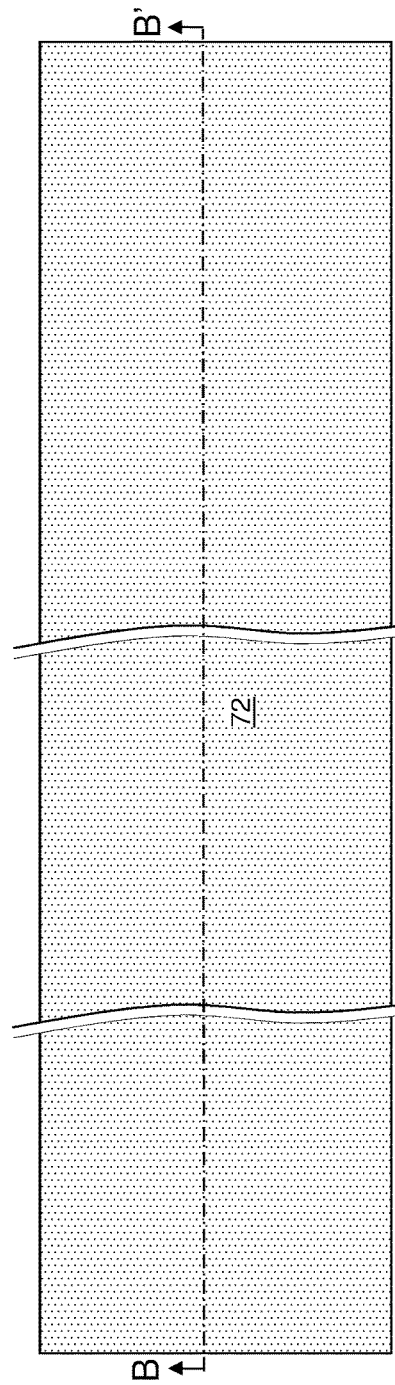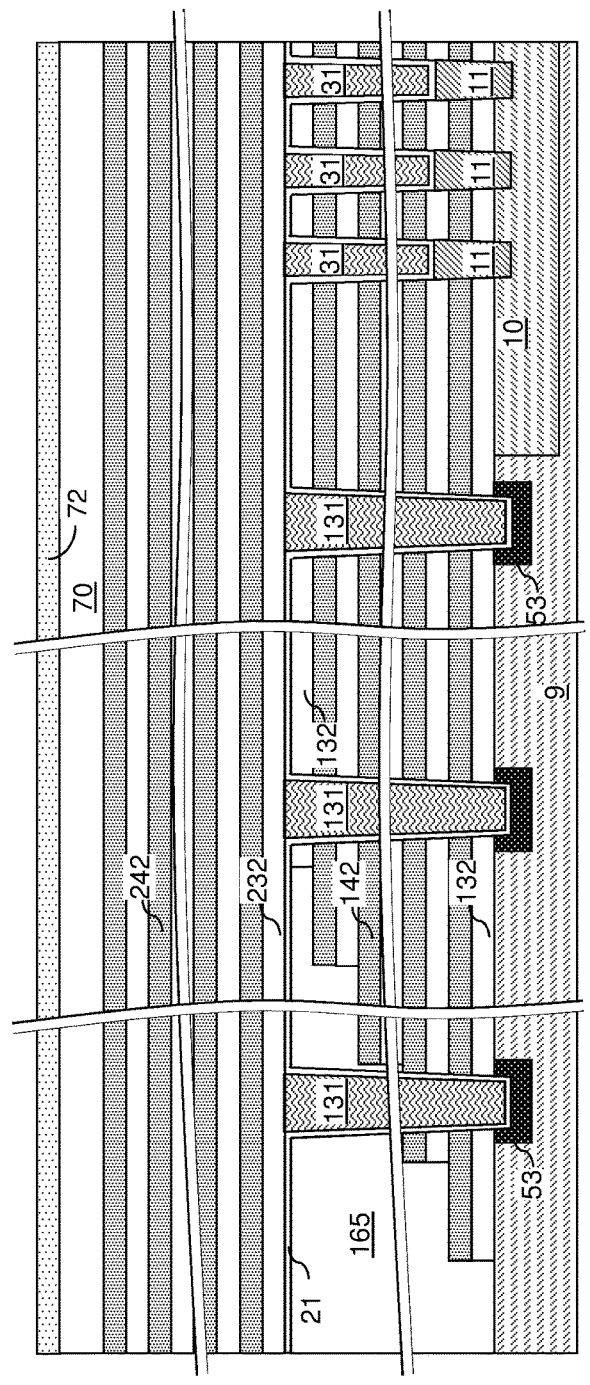

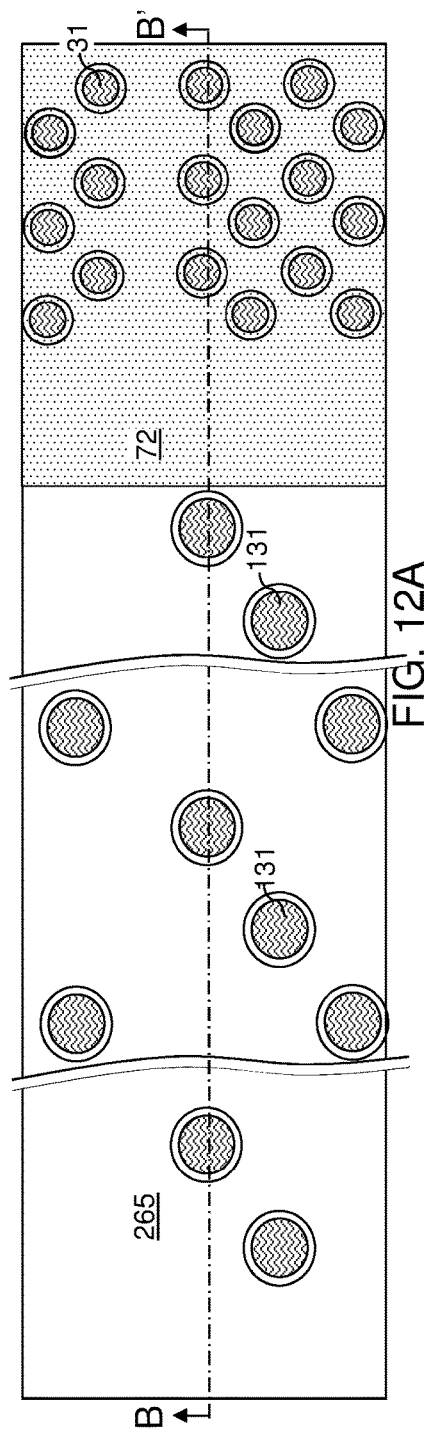
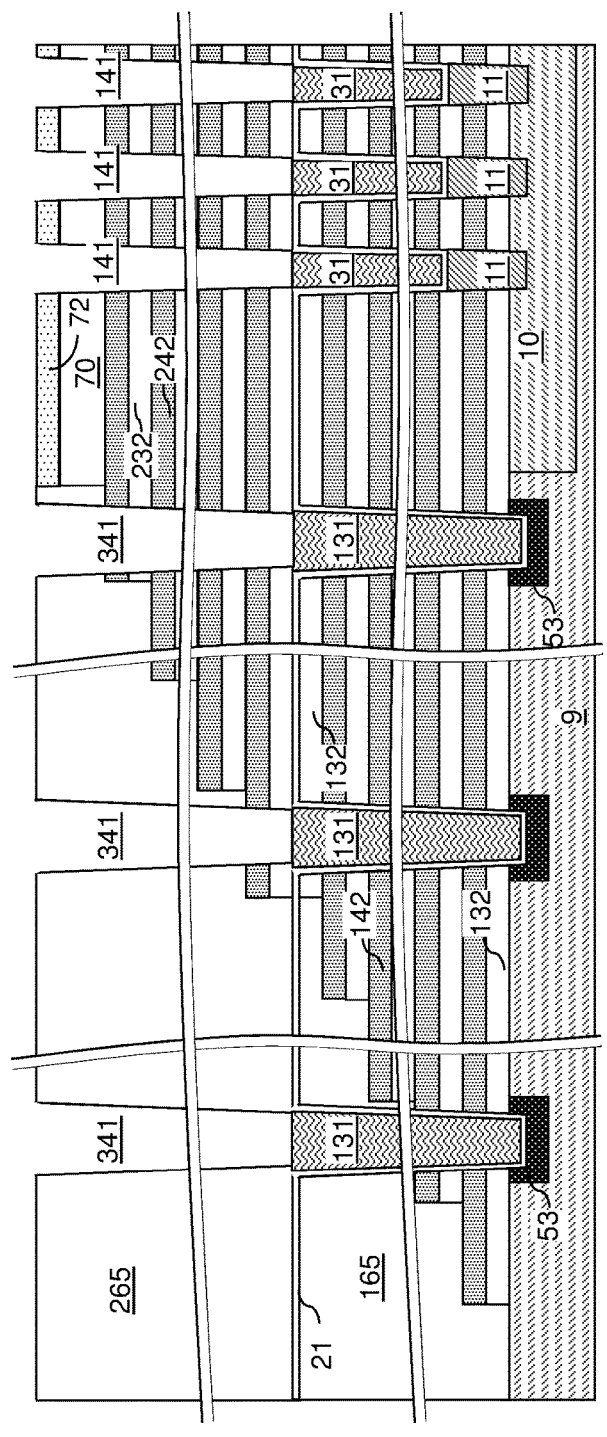
FIG. 12A
FIG. 12B

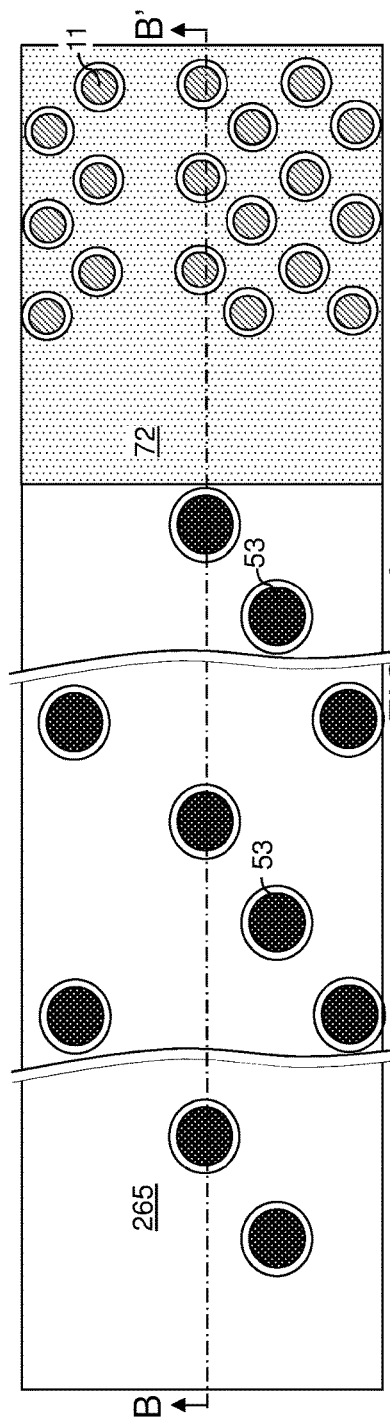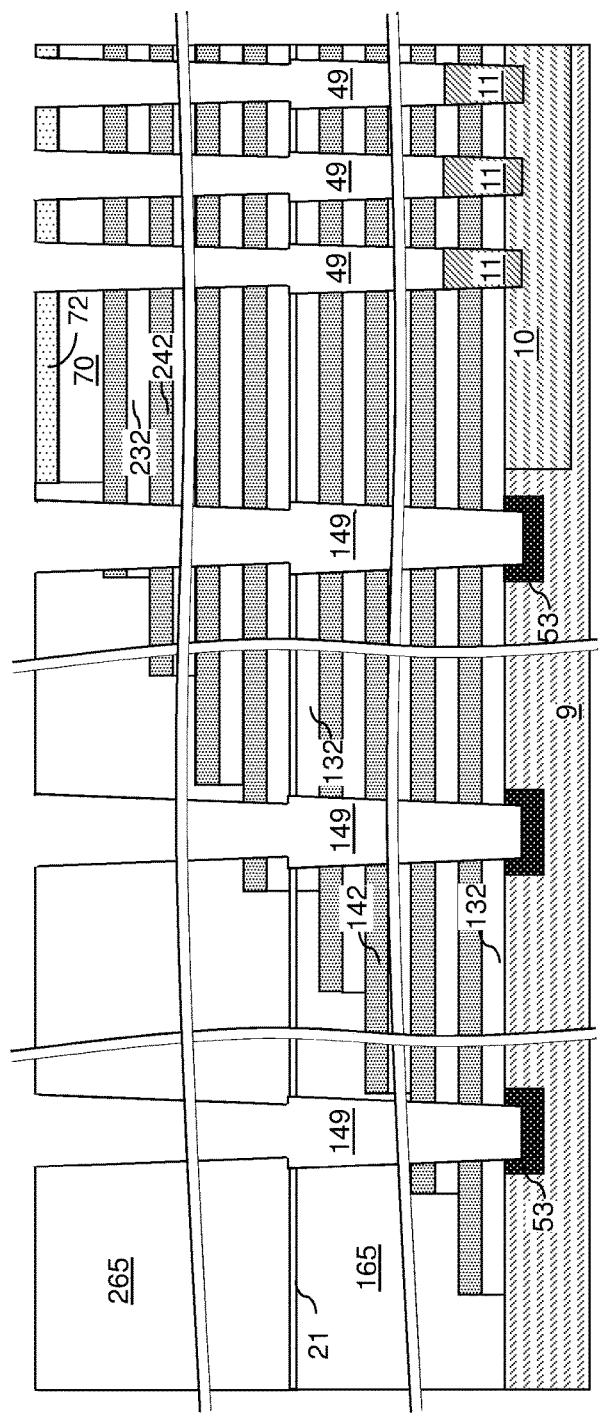

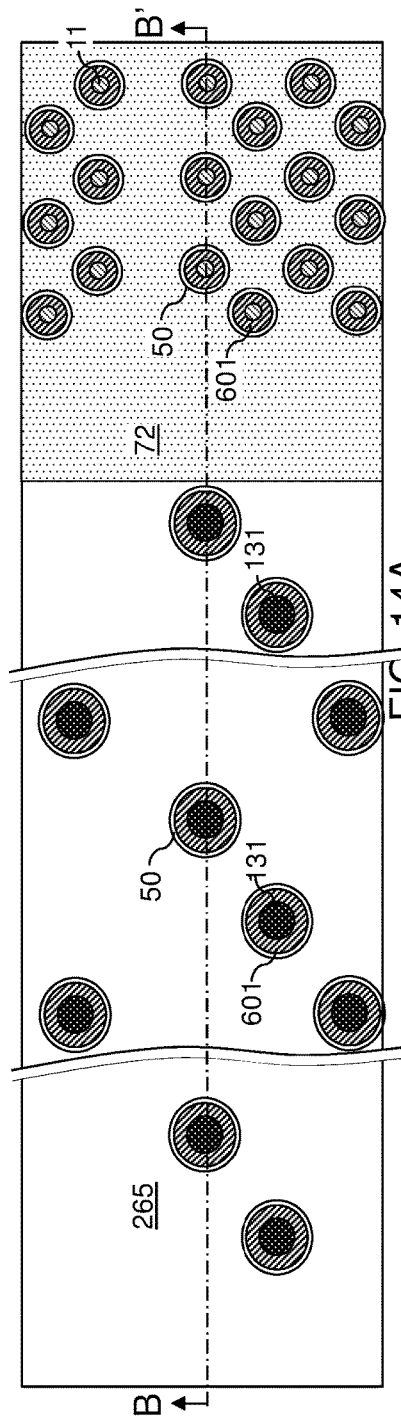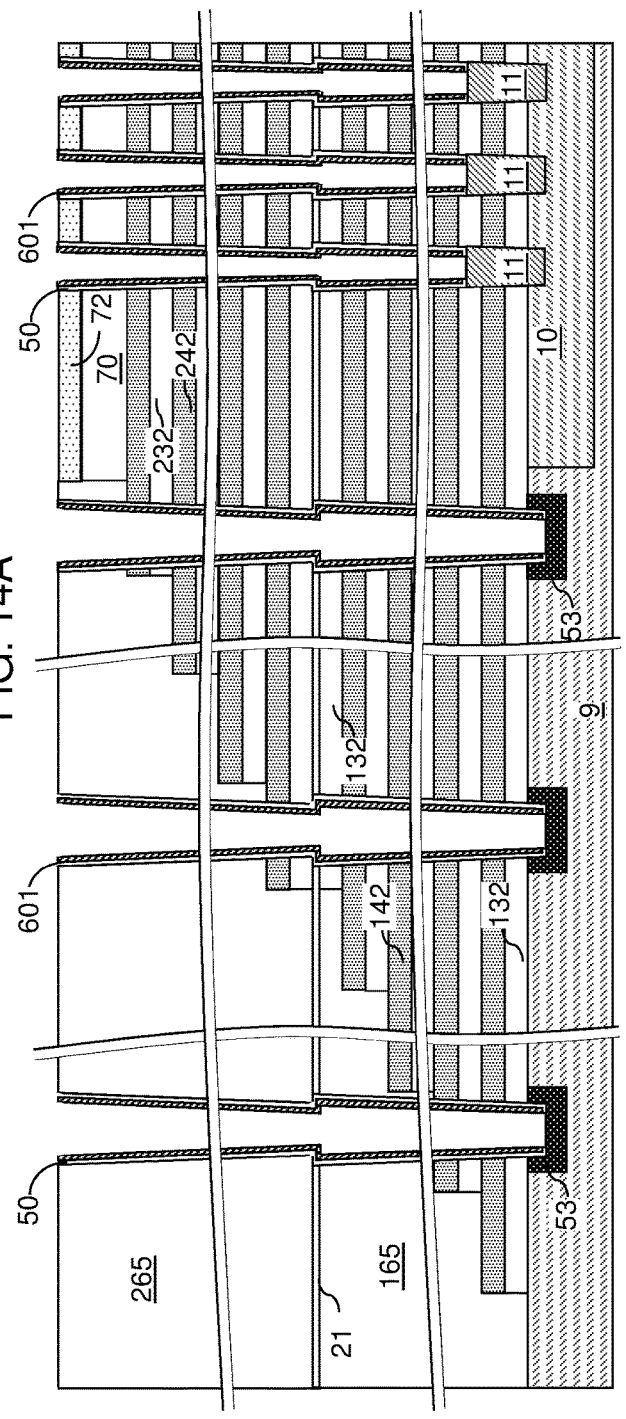
FIG. 14A
FIG. 14B

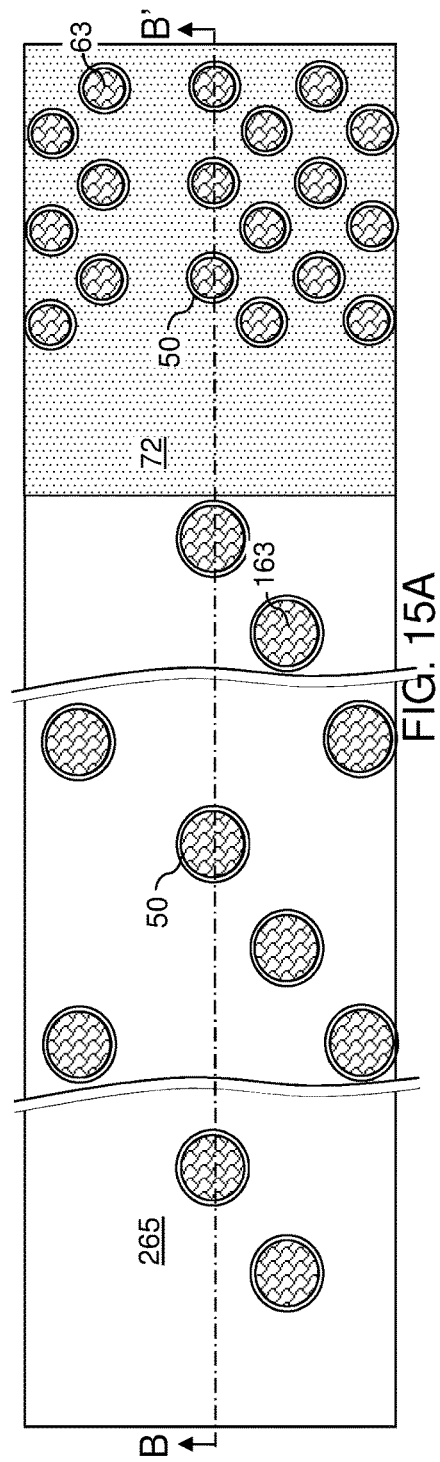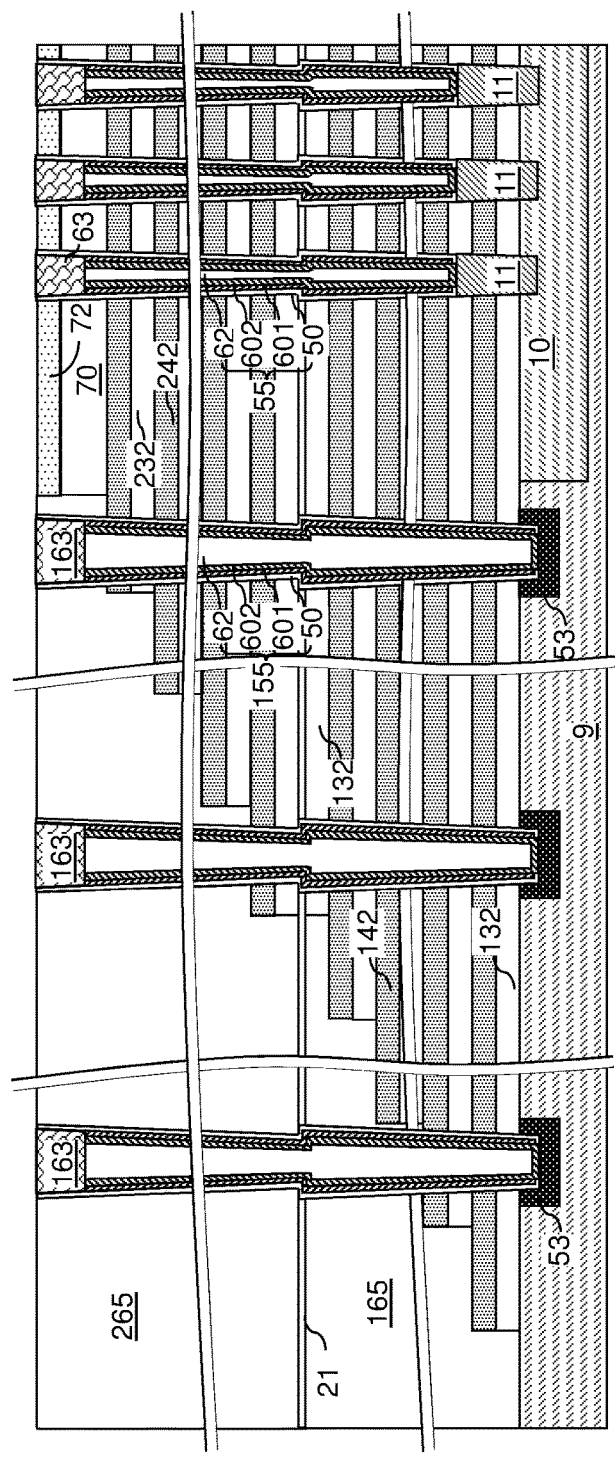
FIG. 15A
FIG. 15B

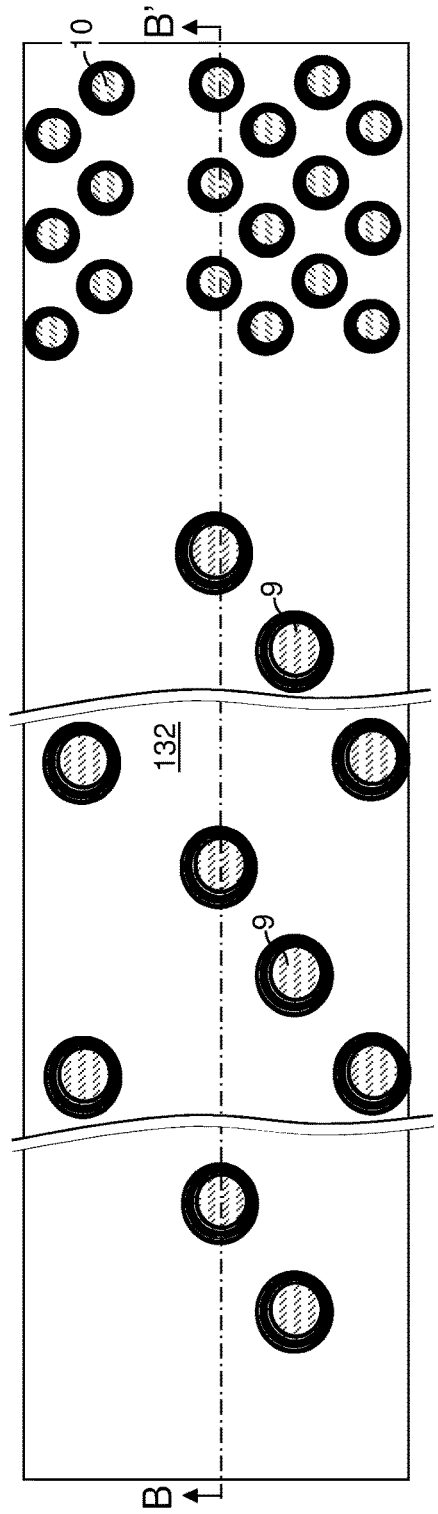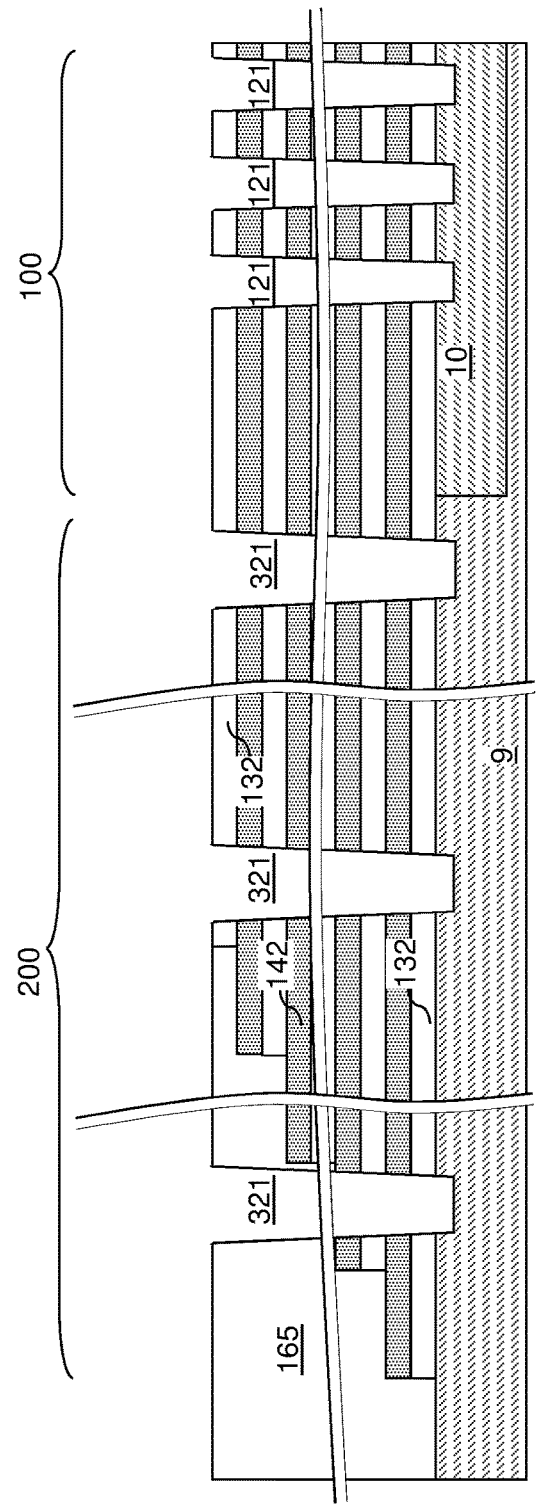
FIG. 22A
FIG. 22B

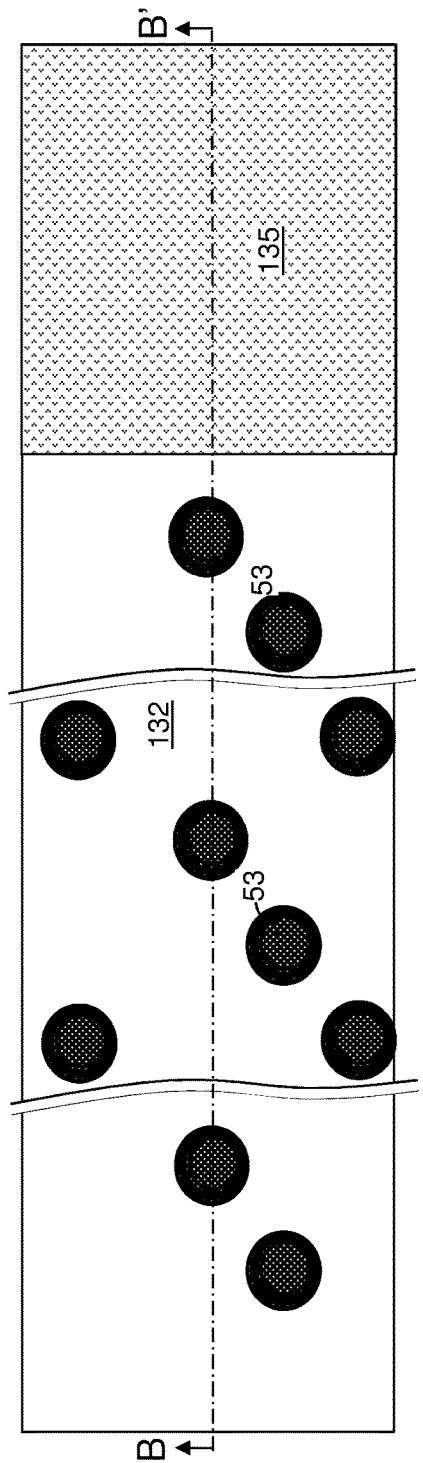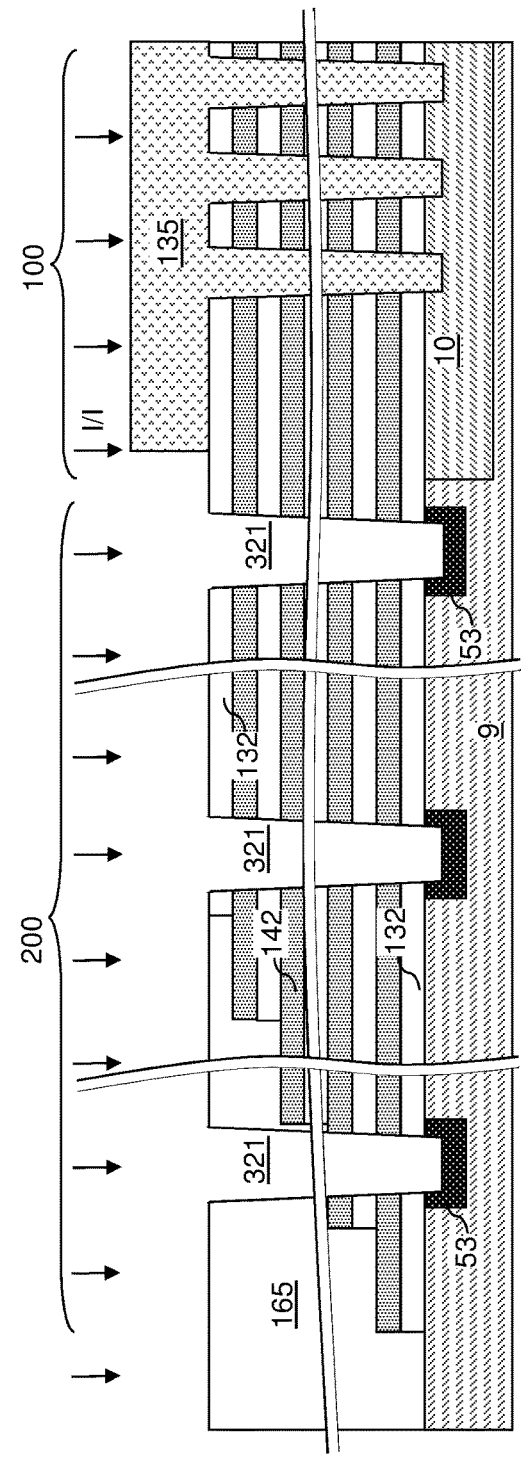
FIG. 23A
FIG. 23B

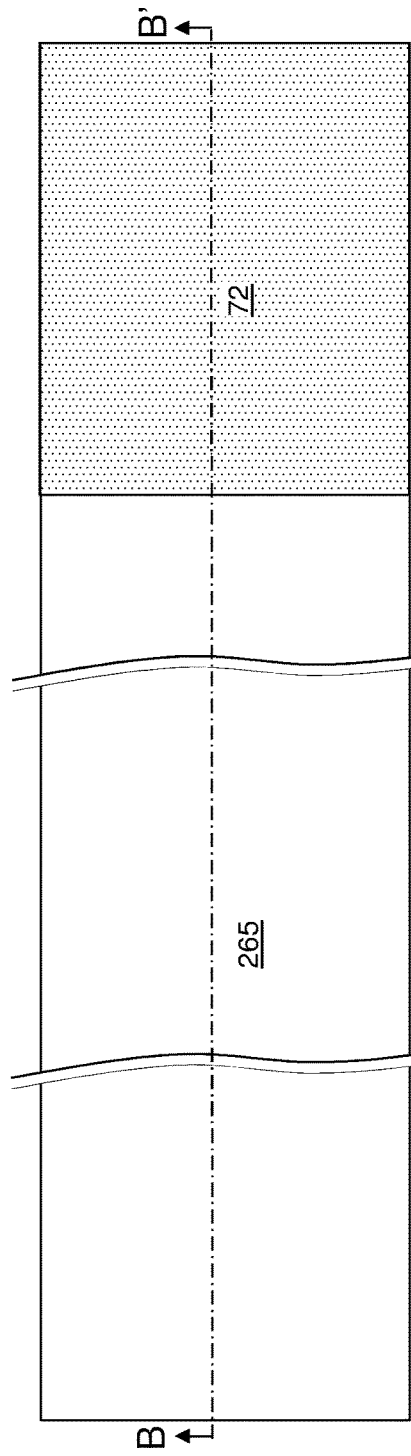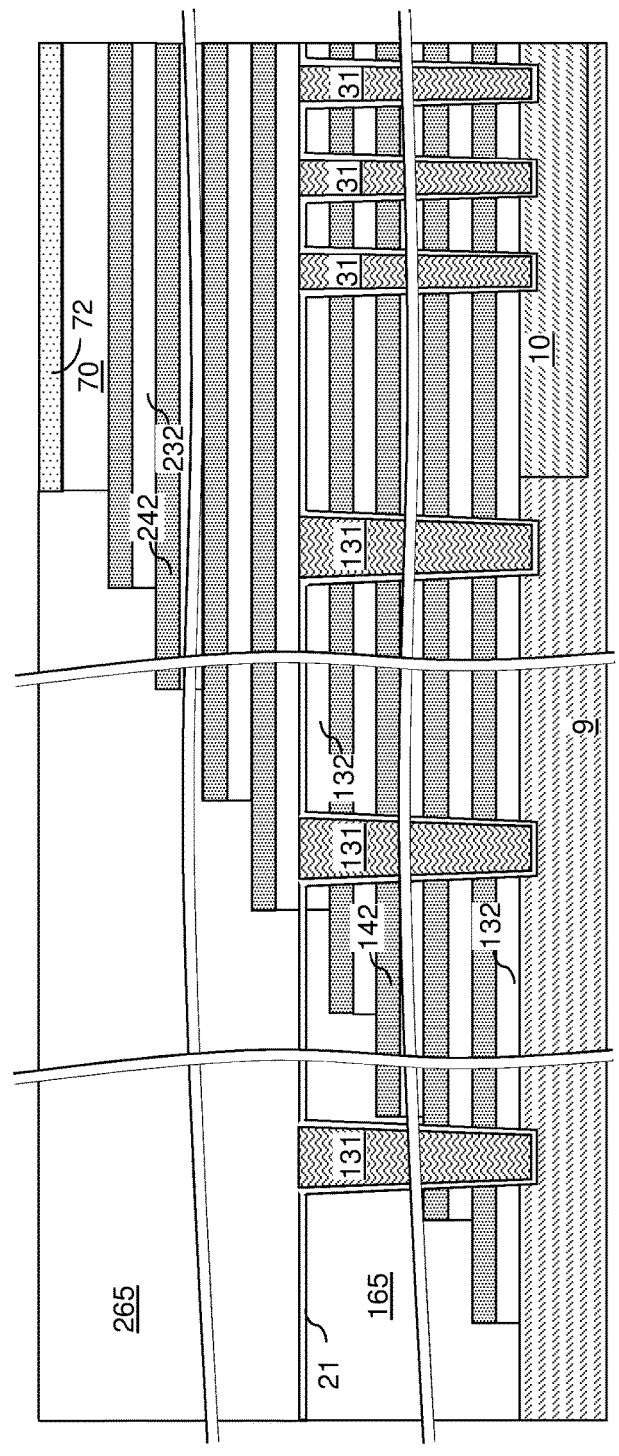

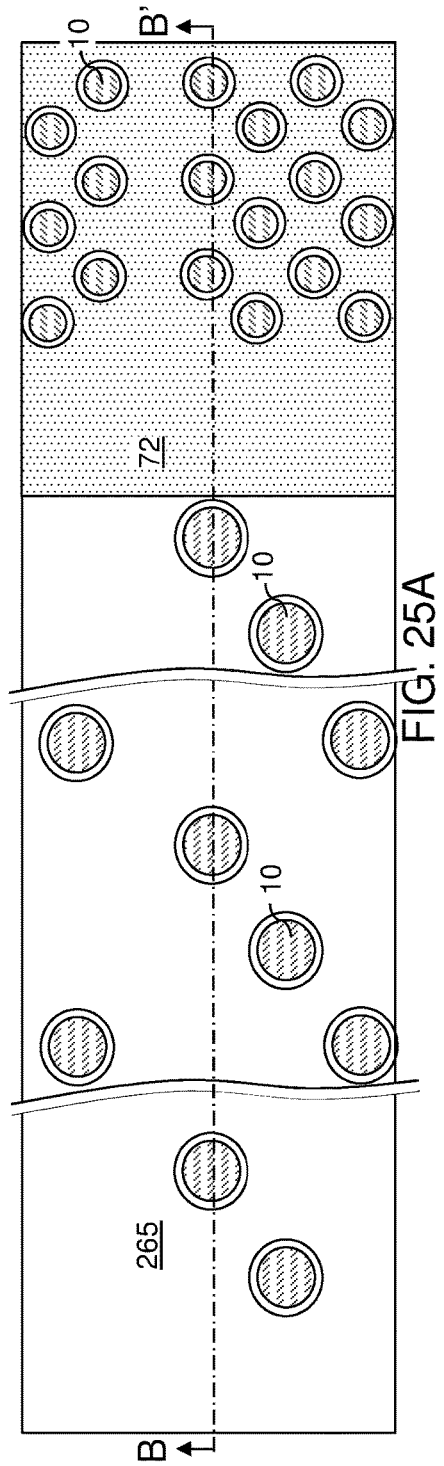
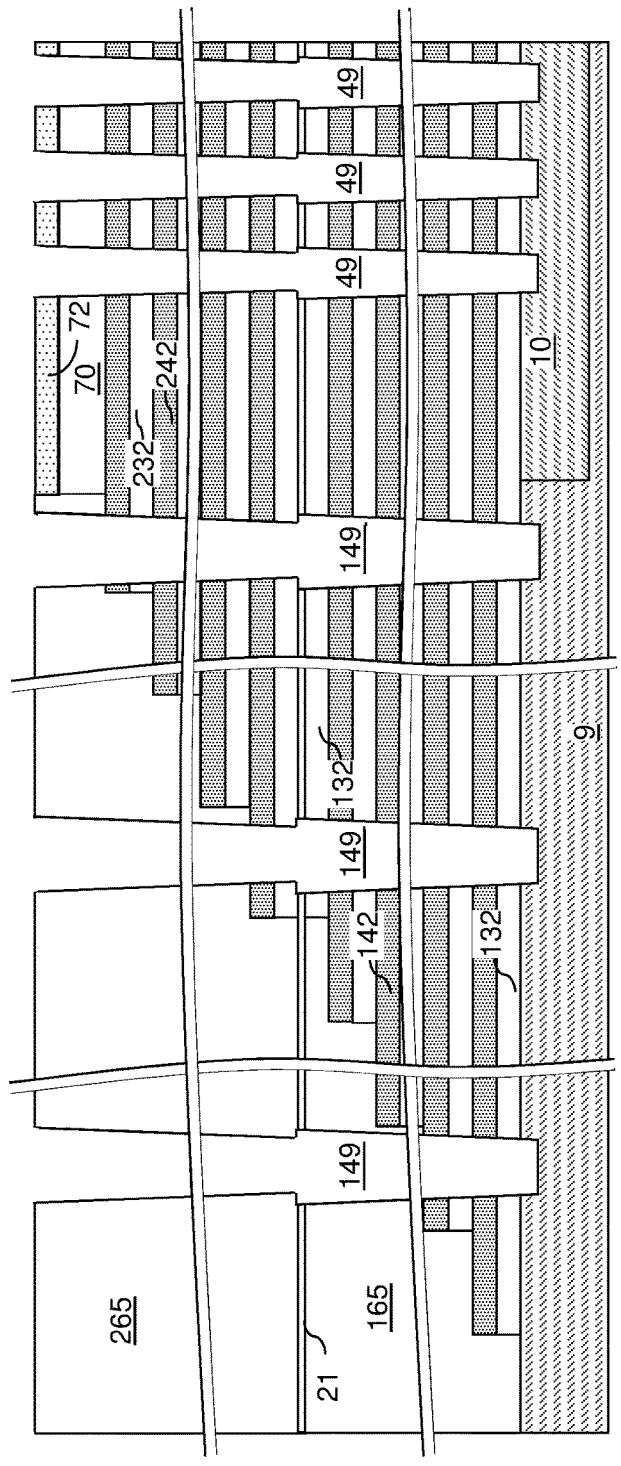
FIG. 25A
FIG. 25B

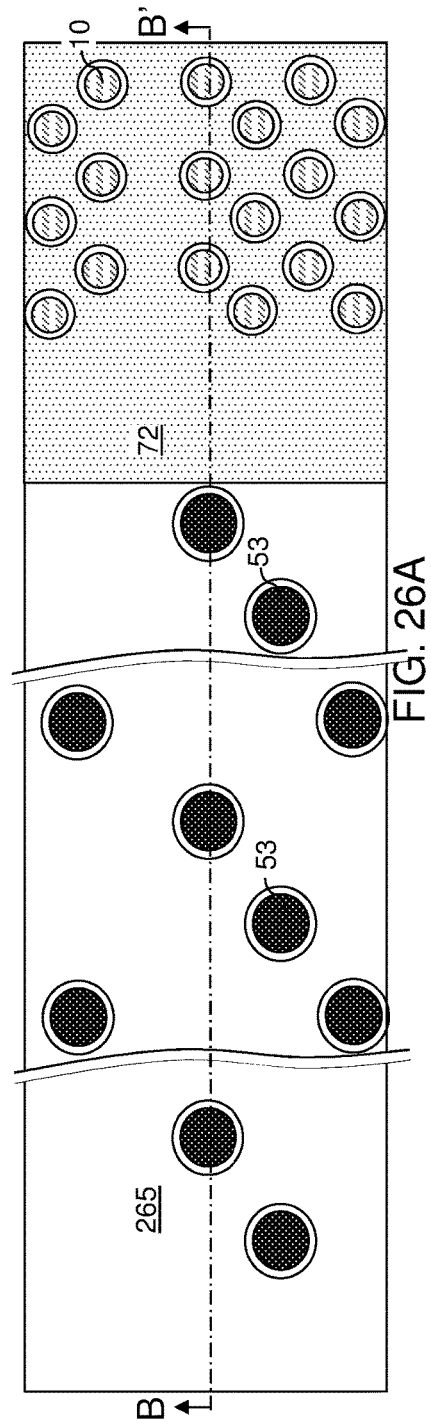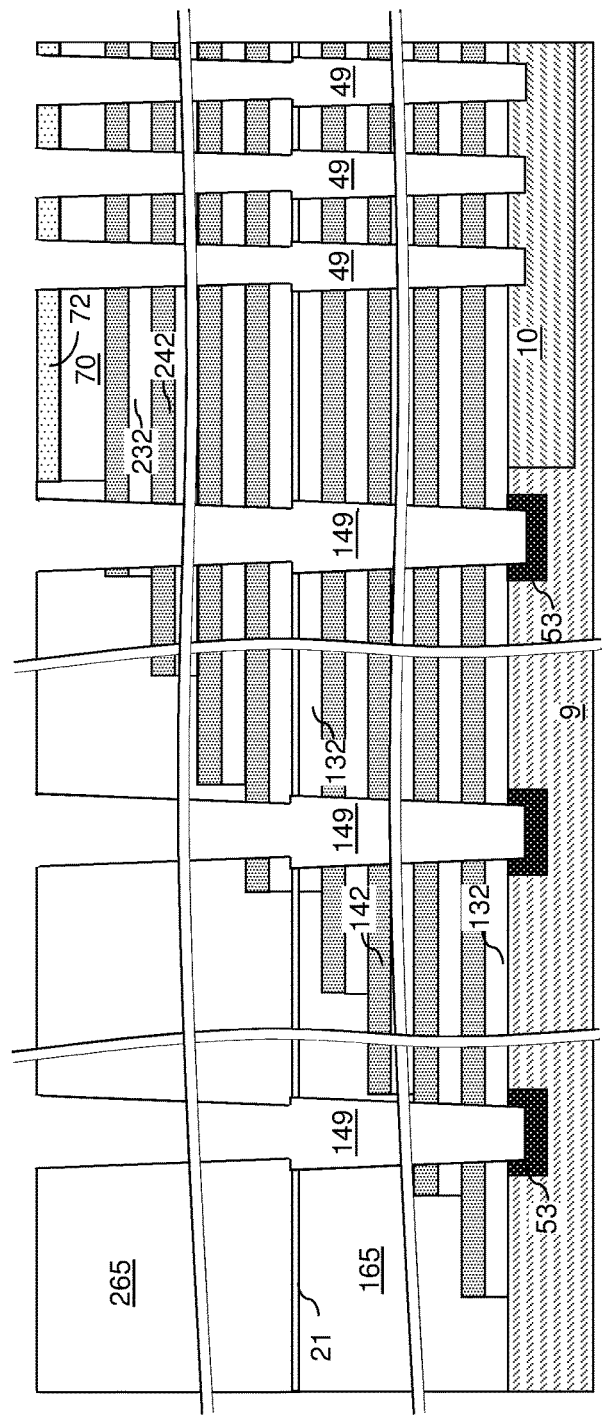

METHOD OF SUPPRESSING EPITAXIAL GROWTH IN SUPPORT OPENINGS AND THREE-DIMENSIONAL MEMORY DEVICE CONTAINING NON-EPITAXIAL SUPPORT PILLARS IN THE SUPPORT OPENINGS

FIELD

The present disclosure relates generally to the field of three-dimensional memory devices and specifically to three-dimensional memory devices, such as vertical NAND strings and other three-dimensional devices, and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises at least one alternating stack of insulating layers and electrically conductive layers located over a semiconductor substrate; memory openings extending through the at least one alternating stack, wherein each of the memory openings is filled with an epitaxial channel portion contacting the semiconductor substrate and a memory stack structure; and support openings extending through the at least one alternating stack, wherein each of the support openings is filled with a support pillar structure. Each of the memory stack structures and the support pillar structures comprises an instance of a layer stack including charge storage material portions, a tunneling dielectric layer, and at least one vertical semiconductor layer. Each instance of the layer stack in the memory stack structures is vertically spaced from the semiconductor substrate by a respective epitaxial channel portion. Each instance of the layer stack in the support pillar structures is in physical contact with an impurity-doped semiconductor material portion within the semiconductor substrate.

According to another aspect of the present disclosure, a method of forming a three-dimensional memory device is provided. An alternating stack of insulating layers and spacer material layers is formed over a semiconductor substrate. Memory openings and support openings are formed through the alternating stack to a top surface of the semiconductor substrate. An impurity species is implanted to first portions of the semiconductor substrate underlying the support openings to form impurity-doped semiconductor material portions, while preventing implantation of the impurity species into second portions of the semiconductor substrate underlying the memory openings. Epitaxial channel portions are grown from the second portions of the semiconductor substrate in bottom regions of the memory openings employing a selective deposition process, while no substantial semiconductor material is epitaxially selectively grown from the impurity-doped semiconductor material portions during the selective deposition process. Memory stack structures and support pillar structures are formed simultaneously on the epitaxial channel portions and on the impurity-doped semiconductor material portions, respectively.

BRIEF DESCRIPTION OF THE DRAWINGS

FIG. 3A is a top-down view of the first exemplary structure after formation of first memory openings in a device region and first support openings in a contact region according to the first embodiment of the present disclosure.

FIG. 3B is a vertical cross-sectional view of the first exemplary structure of FIG. 3A along the vertical plane B-B'.

FIG. 5A is a top-down view of the first exemplary structure after isotropically recessing the anisotropically deposited patterning film according to the first embodiment of the present disclosure.

FIG. 5B is a vertical cross-sectional view of the first exemplary structure of FIG. 5A along the vertical plane B-B'.

FIG. 8A is a top-down view of the first exemplary structure after formation of epitaxial channel portions according to the first embodiment of the present disclosure.

FIG. 8B is a vertical cross-sectional view of the first exemplary structure of FIG. 8A along the vertical plane B-B'.

FIG. 9A is a top-down view of the first exemplary structure after formation of sacrificial opening fill portions according to the first embodiment of the present disclosure.

FIG. 9B is a vertical cross-sectional view of the first exemplary structure of FIG. 9A along the vertical plane B-B'.

FIG. 10A is a top-down view of the first exemplary structure after formation of a second alternating stack of second insulating layers and second sacrificial material layers according to the first embodiment of the present disclosure.

FIG. 10B is a vertical cross-sectional view of the first exemplary structure of FIG. 10A along the vertical plane B-B'.

FIG. 12A is a top-down view of the first exemplary structure after formation of second memory openings in the device region and second support openings in the contact region according to the first embodiment of the present disclosure.

FIG. 12B is a vertical cross-sectional view of the first exemplary structure of FIG. 12A along the vertical plane B-B'.

FIG. 13A is a top-down view of the first exemplary structure after formation of inter-tier memory openings and inter-tier support openings according to the first embodiment of the present disclosure.

FIG. 13B is a vertical cross-sectional view of the first exemplary structure of FIG. 13A along the vertical plane B-B'.

FIG. 14A is a top-down view of the first exemplary structure after formation of memory films and first semiconductor channels according to the first embodiment of the present disclosure.

FIG. 14B is a vertical cross-sectional view of the first exemplary structure of FIG. 14A along the vertical plane B-B'.

FIG. 15A is a top-down view of the first exemplary structure after formation of second semiconductor channels, dielectric cores, drain regions, and dummy drain regions according to the first embodiment of the present disclosure.

FIG. 15B is a vertical cross-sectional view of the first exemplary structure of FIG. 15A along the vertical plane B-B'.

FIG. 22A is a top-down view of a second exemplary structure after formation of first memory openings and first support openings according to a second embodiment of the present disclosure.

FIG. 22B is a vertical cross-sectional view of the second exemplary structure of FIG. 22A along the vertical plane B-B'.

FIG. 23A is a top-down view of a second exemplary structure during formation of impurity-doped semiconductor material portions according to the second embodiment of the present disclosure.

FIG. 23B is a vertical cross-sectional view of the second exemplary structure of FIG. 23A along the vertical plane B-B'.

FIG. 24A is a top-down view of a second exemplary structure after formation of a second alternating stack and a second retro-stepped dielectric material portion according to the second embodiment of the present disclosure.

FIG. 24B is a vertical cross-sectional view of the second exemplary structure of FIG. 24A along the vertical plane B-B'.

FIG. 25A is a top-down view of a third exemplary structure after formation of inter-tier memory openings and inter-tier support openings according to a third embodiment of the present disclosure.

FIG. 25B is a vertical cross-sectional view of the third exemplary structure of FIG. 25A along the vertical plane B-B'.

FIG. 26A is a top-down view of the third exemplary structure after formation of impurity-doped semiconductor material portions according to the third embodiment of the present disclosure.

FIG. 26B is a vertical cross-sectional view of the third exemplary structure of FIG. 26A along the vertical plane B-B'.

DETAILED DESCRIPTION

Figure 1:
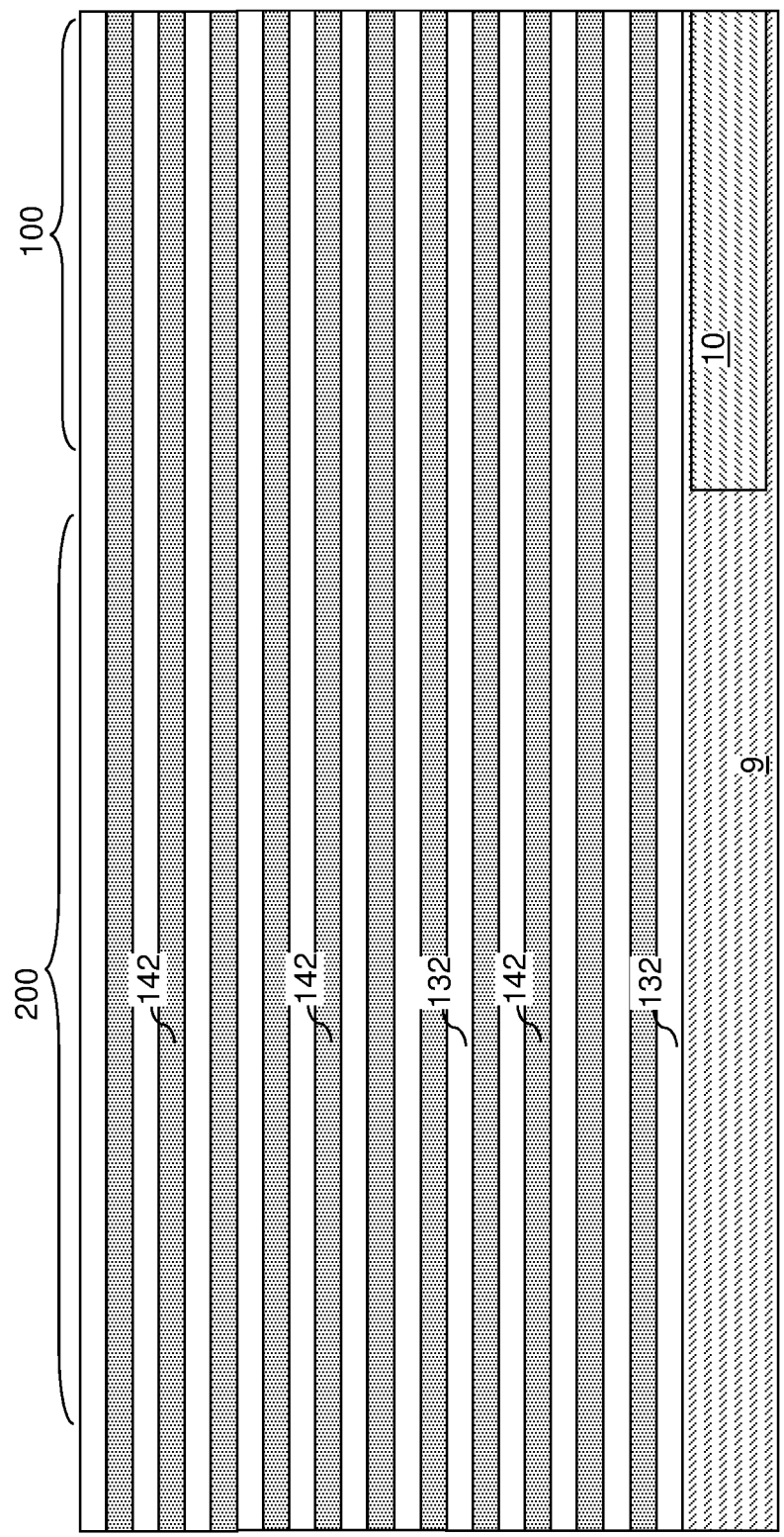
FIG. 1 is a vertical cross-sectional view of a first exemplary structure after formation of a first alternating stack of first insulating layers and first sacrificial material layers according to a first embodiment of the present disclosure.

As discussed above, the present disclosure is directed to three-dimensional memory devices and methods of making the same, the various aspects of which are described below. An embodiment of the disclosure can be employed to form semiconductor devices, such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 9 can comprise a single crystalline semiconductor material, such as a single crystal silicon wafer. A doped semiconductor well 10 may be optionally formed in an upper portion of the substrate semiconductor layer 9 by implanting p-type dopants or n-type dopants. The combination of the remaining portion of the substrate semiconductor layer 9 and the doped semiconductor well 10 is herein referred to as a semiconductor substrate (9, 10).

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the semiconductor substrate (9, 10).

The first exemplary structure includes a memory array region 100, in which memory devices can be subsequently formed, and a contact region 200, in which stepped surfaces are subsequently formed. As used herein, a "contact region" refers to a region in which contact via structures are to be formed. At least one semiconductor device for a peripheral circuitry can be formed in a peripheral device region (not shown). The at least one semiconductor device can include, for example, one or more field effect transistors. The least one semiconductor device for the peripheral circuitry can contain a driver circuit for memory devices to be subsequently formed, which can include at least one NAND device.

An alternating stack of first material layers and second material layers is subsequently formed. Each first material layer can include a first material, and each second material layer can include a second material that is different from the first material. The first material layers can be insulating layers, and the second material layers can be spacer material layers that provide vertical spacing between each vertically neighboring pair of insulating layers. In one embodiment, the spacer material layers can be dielectric material layers, which are herein referred to as spacer dielectric layers. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

Figure 2:
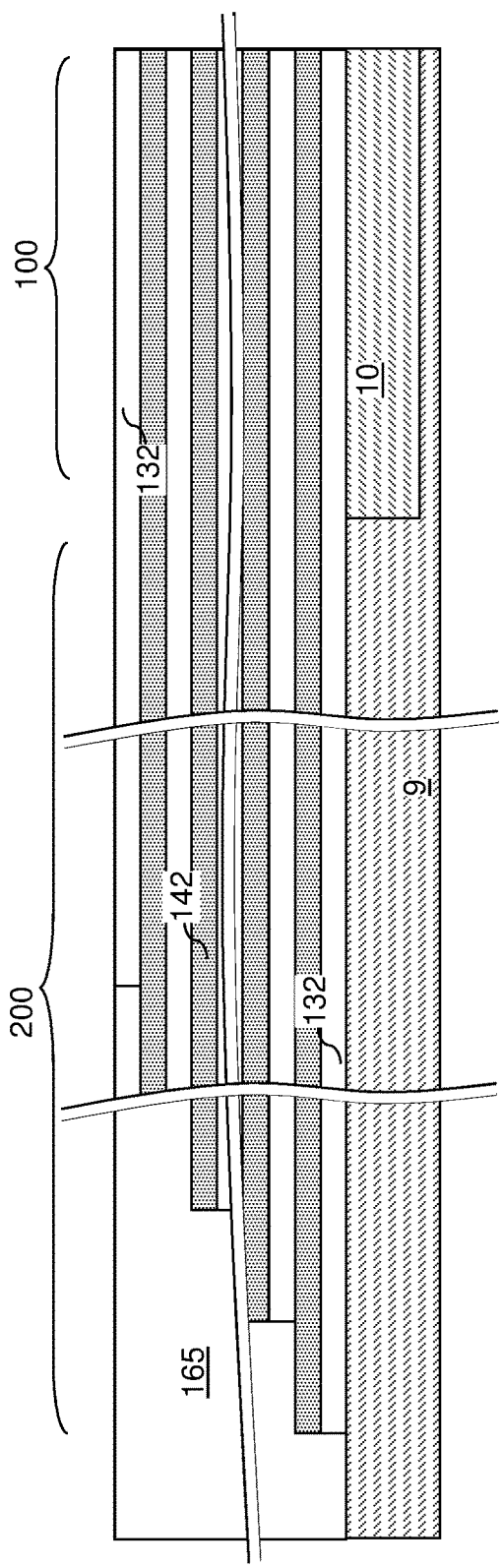
FIG. 2 is a vertical cross-sectional view of the first exemplary structure after formation of first stepped surfaces and a first retro-stepped dielectric material portion according to the first embodiment of the present disclosure.

Referring to FIG. 2, the lower tier structure (132, 142) can be patterned to form first stepped surfaces, which are also referred to as first stepped terraces. The first stepped terraces are formed in the contact region 200. The contact region 200 includes a first stepped area in which the first stepped surfaces are formed, and a second stepped area in which additional stepped surfaces are to be subsequently formed in an upper tier structure (to be subsequently formed over the lower tier structure). The memory array region 100 is provided adjacent to the contact region 200. Memory devices including memory stack structures can be subsequently formed in the memory array region 100. The first stepped surfaces can be formed, for example, by forming a mask layer with an opening therein, etching a cavity within the levels of the topmost first sacrificial material layer 142 and the topmost first insulating layer 132, and iteratively expanding the etched area and vertically recessing the cavity by etching each pair of a first insulating layer 132 and a first sacrificial material layer 142 located directly underneath the bottom surface of the etched cavity within the etched area. The first alternating stack (132, 142) is patterned such that each underlying first sacrificial material layer 142 laterally protrudes farther than any overlying first sacrificial material layer 142 in the etched region, and each underlying first insulating layer 132 laterally protrudes farther than any overlying first insulating layer 132 in the etched region. Thus, within the area of the first stepped terraces, each spacer material layer (such as the first sacrificial dielectric layer 142) laterally extends farther than any overlying spacer material layer within the first alternating stack (132, 142). The contact region can be a contact region of the first alternating stack (132, 142). The cavity is herein referred to as a first stepped cavity.

A dielectric material is deposited to fill the first stepped cavity. Excess portions of the dielectric material overlying the topmost surface of the first alternating stack (132, 142), are removed for example, by chemical mechanical planarization. The remaining portion of the deposited dielectric material forms a first retro-stepped dielectric material portion 165, which is formed on the first stepped surfaces. The first dielectric material portion 165 is retro-stepped. As used herein, a "retro-stepped" element refers to an element that has stepped surfaces and a horizontal cross-sectional area that increases monotonically as a function of a vertical distance from a top surface of a substrate on which the element is present. A lower tier structure, which is also referred to as a first tier structure, comprises the first alternating stack (132, 142) and the first retro-stepped dielectric material portion 165.

Referring to FIGS. 3A and 3B, a photoresist layer 35 can be applied over the lower tier structure (132, 142, 165), and is lithographically patterned to form openings in the memory array region 100 and the contact region 200. The pattern in the photoresist layer 35 is transferred through the lower tier structure (132, 142, 165) to form first openings (121, 321) through the lower tier structure to a top surface of the substrate (9, 10).

The first openings (121, 321) include first memory openings 121 that are formed in the memory array region 100 and first support openings 321 that are formed in the contact region 200. For example, a lithographic material stack including the photoresist layer 35 and one or more optional additional layers, such as a hard mask layer, etc., can be formed over the lower tier structure (132, 142, 165), and can be lithographically patterned to form openings within the lithographic material stack. The pattern in the lithographic material stack can be transferred through the entirety of the lower tier structure (132, 142, 165) by at least one anisotropic etch that employs the patterned lithographic material stack as an etch mask. Portions of the lower tier structure (132, 142, 165) underlying the openings in the patterned lithographic material stack are etched to form the first openings (121, 321). In other words, the transfer of the pattern in the patterned lithographic material stack through the lower tier structure (132, 142, 165) forms the first openings (121, 321).

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first dielectric material portion 165. The anisotropic etch can be, for example, a series of reactive ion etches. The sidewalls of the first openings (121, 321) can be substantially vertical, or can be tapered. Subsequently, the patterned lithographic material stack can be subsequently removed, for example, by ashing.

The first support opening 321 are formed through the first alternating stack (132, 142) and through one of the first dielectric material portion 165 in the contact region 200 concurrently with formation of the first memory openings 121 in the memory array region 100. In one embodiment, the substrate (9, 10) can be employed as a stopping layer for the anisotropic etch process. Alternatively, an optional etch stop layer above the substrate may be used as a stopping layer. In one embodiment, the first openings (121, 321) may extend below the top surface of the substrate (9, 10) by an overetch. The lateral dimensions (e.g., a diameter) of the first openings (121, 321) can be from about 20 nm to 200 nm at an upper portion of each first opening (121, 321), and can be about 10 nm to 150 nm at a lower portion of each first opening (121, 321), although lesser and greater dimensional can also be employed. The first support openings 321 are wider (e.g., have a larger diameter if they have a circular horizontal cross sectional shape) than the first memory openings 321, such as at least 20% wider, for example 25 to 500% wider. In one embodiment, the first memory openings 121 can be formed as an array of openings, which can be a periodic two-dimensional array of openings. The first support openings 321 can be formed as discrete openings that are mutually separated from one another, and may not form a periodic two-dimensional array pattern. The nearest neighbor lateral separation distance among the first support openings 321 may be greater than twice (e.g., three times or more) than the nearest neighbor distance among the first memory openings 121.

Figure 4A:
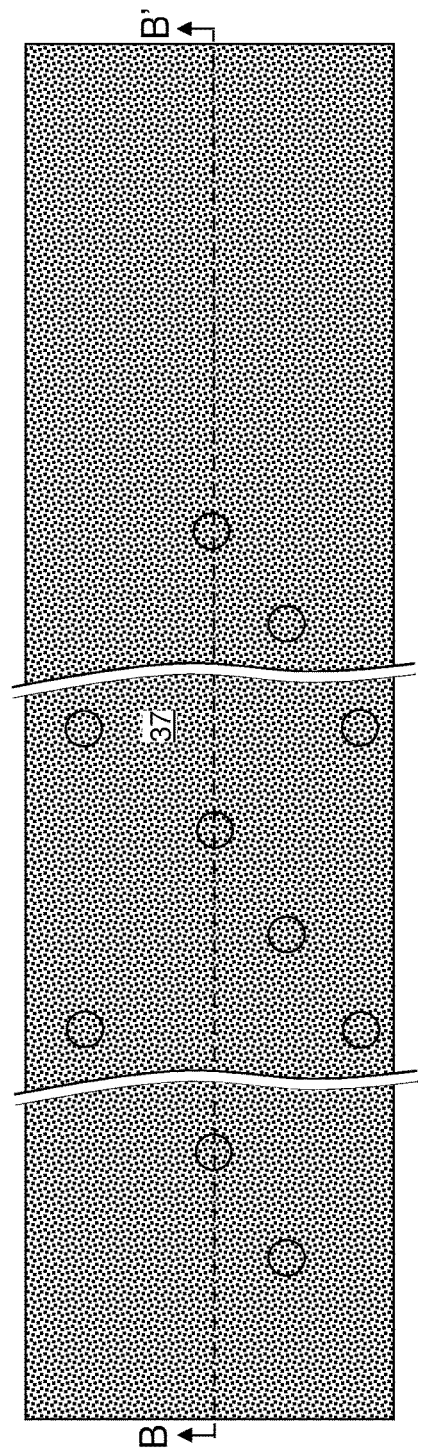
FIG. 4A is a top-down view of the first exemplary structure after formation of an anisotropically deposited patterning film according to the first embodiment of the present disclosure.
Figure 4B:
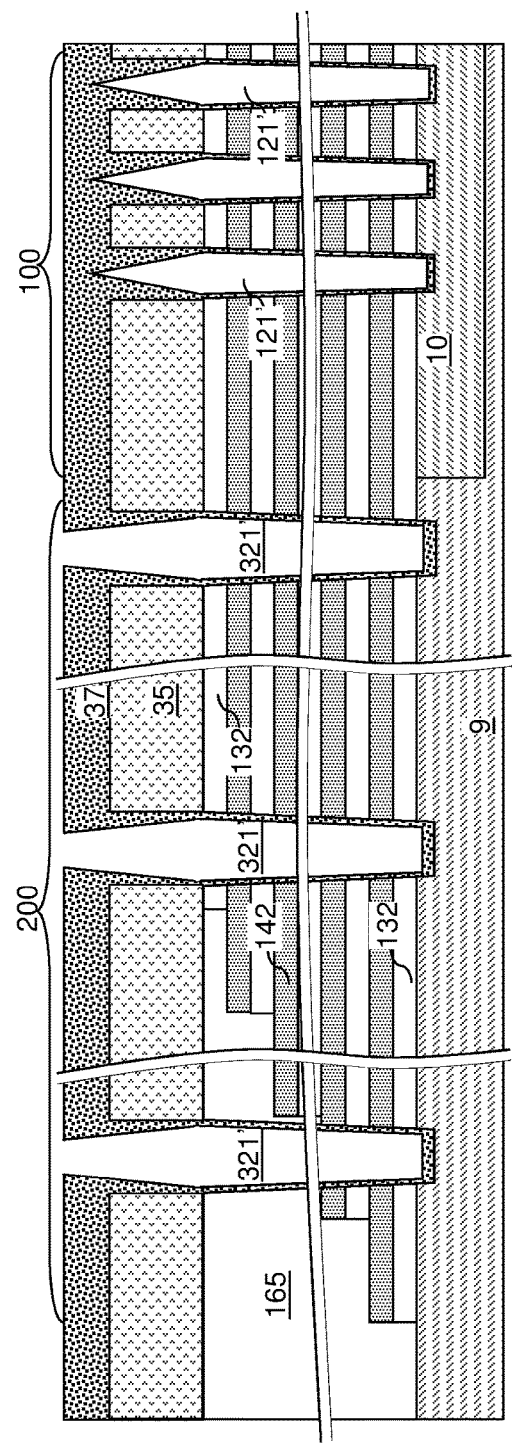
FIG. 4B is a vertical cross-sectional view of the first exemplary structure of FIG. 4A along the vertical plane B-B'.

Referring to FIGS. 4A and 4B, a patterning film 37 can be deposited over the photoresist layer 35 employing an anisotropic deposition method. The patterning film 37 can be a carbon-based film, such as a carbon or fluoro-carbon polymer. In one embodiment, the carbon-based film 37 is a film that can be subsequently removed by ashing, such as Advanced Patterning Film™ by Applied Materials, Inc. Alternatively, the film 37 may be a fluorocarbon polymer deposited using a rich $C_4H_6$ and $CH_4$ sources. The patterning film 37 is deposited with a greater thickness on horizontal surfaces relative to vertical surfaces, and on raised surfaces relative to recessed surfaces. The patterning film 37 can seal volumes of the narrower first memory openings 121 to form a sealed cavity 121' within each volume of the first memory opening 121. The patterning film 37 does not seal volumes of the wider first support openings 321. Thus, each cavity within the first support openings 321 is continuously adjoined to the ambient overlying the topmost surface of the patterning film 37, and each cavity (i.e., each sealed cavity 121') within the first memory openings is isolated from the ambient overlying the topmost surface of the patterning film 37.

Referring to FIGS. 5A and 5B, the anisotropically deposited patterning film 37 can be recessed by an etch process, such as an isotropic or anisotropic etch process. Portions of the patterning film 37 within the first support openings 321 are removed during the isotropic recessing of the patterning film 37, while the sealed cavities 121' in the memory array region 100 remain sealed. In an alternative embodiment, the patterning film 37 may be deposited only over the top surface of the alternating stack (132, 142) without extending into the openings 121 or 321 (e.g., without covering the bottom and/or sidewalls of the openings 121 and 321). In this alternative embodiment, the recess etching step is omitted and the patterning film has an as-deposited configuration shown in FIGS. 5A and 5B.

Figure 6A:
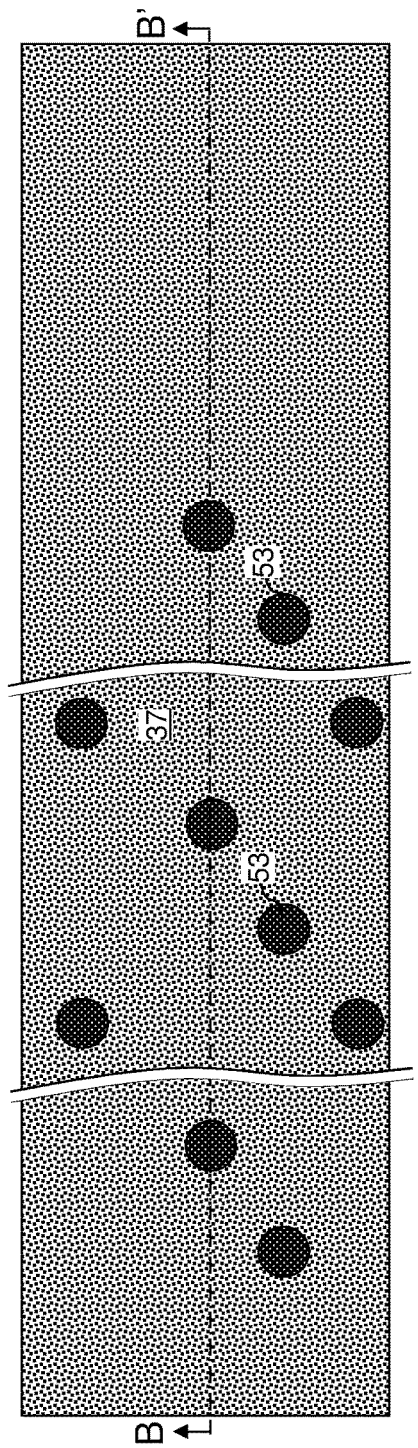
FIG. 6A is a top-down view of the first exemplary structure after formation of impurity-doped semiconductor material portions according to the first embodiment of the present disclosure.
Figure 6B:
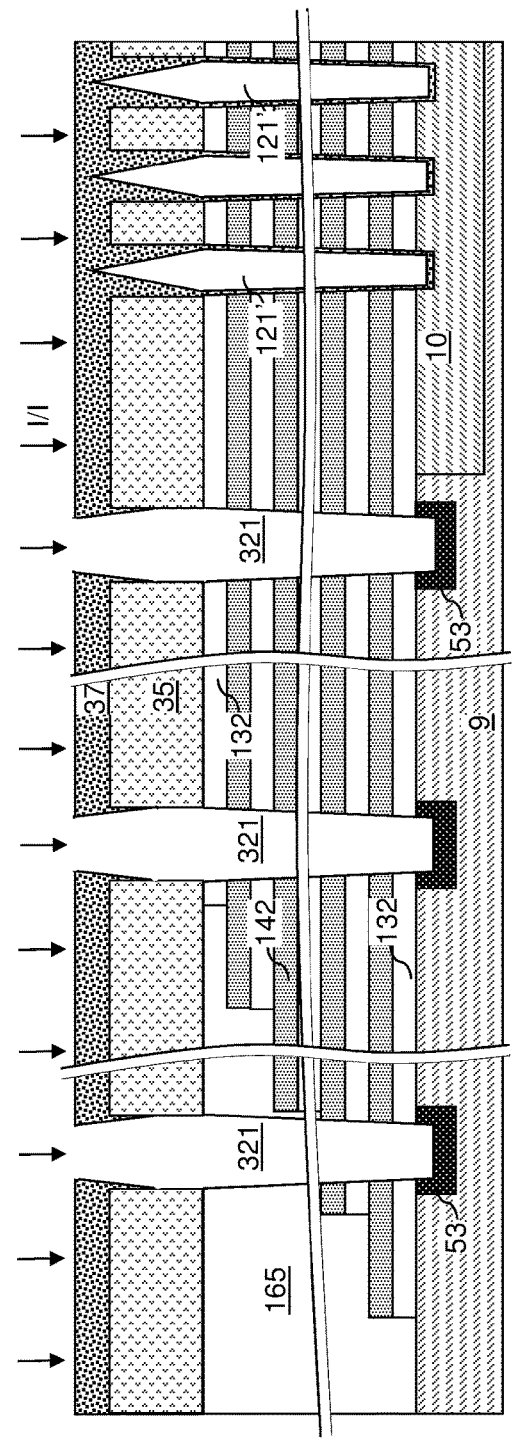
FIG. 6B is a vertical cross-sectional view of the first exemplary structure of FIG. 6A along the vertical plane B-B'.

Referring to FIGS. 6A and 6B, impurity species can be doped (e.g., implanted) into portions of the semiconductor substrate (9, 10) that underlie the first support openings 321, while the patterning film 37 blocks the impurity species in the memory array region 100. Thus, implantation of the impurity species into portions of the semiconductor substrate (9, 10) underlying the first memory openings 121 is prevented by the patterning film 37. The impurity species can be implanted employing a directional ion implantation process in which the angle of incidence is substantially zero, i.e., normal to the horizontal plane including the top surface of the semiconductor substrate (9, 10). Each implanted region includes the semiconductor material of the semiconductor substrate (9, 10) and the implanted impurity species, and is herein referred to as an impurity-doped semiconductor material portion 53, i.e., a semiconductor material portion that is doped with an impurity species.

The impurity species are selected among molecules or atoms that can significantly impede deposition (e.g., selective epitaxial growth) of a semiconductor material by altering the structural characteristics of the semiconductor material of the semiconductor substrate (9, 10) during a subsequent selective deposition process (e.g., a selective epitaxial growth process). For example, the impurity species can have an atomic radius that differs from the atomic radius of the atoms in the semiconductor substrate (9, 10) by at least 4%, and preferably by more than 6%, such as by 25 to 70%. In one embodiment, the impurity species can include an element selected from carbon and boron. For example, the impurity species can include carbon ions, fluorine ions, hydrogen ions, $BCl_3$, $BF_3$, $B_2H_6$, $CH_4$, $CF_4$, $CCl_4$, $CF_2Cl_2$, or other boron hydrides, boron halides, carbon hydrides, or carbon halides. If the semiconductor substrate (9, 10) comprises a silicon substrate, such as a single crystal silicon wafer or layer, then boron atoms, carbon atoms, hydrogen atoms, and/or halogen (e.g., fluorine) atoms may comprise the impurity species that are doped into the substrate.

The impurity species are implanted at a concentration that can significantly impede deposition of a semiconductor material during the subsequent selective deposition process. In one embodiment, the impurity species can be present in the impurity-doped semiconductor material portions 52 at a concentration in a range from $5.0 \times 10^{19}/cm^3$ to $5.0 \times 10^{21}/cm^3$. Due to lateral straggle of the implanted impurity species, each impurity-doped semiconductor material portion 53 can extend to a top surface of the semiconductor substrate (9, 10).

Figure 7A:
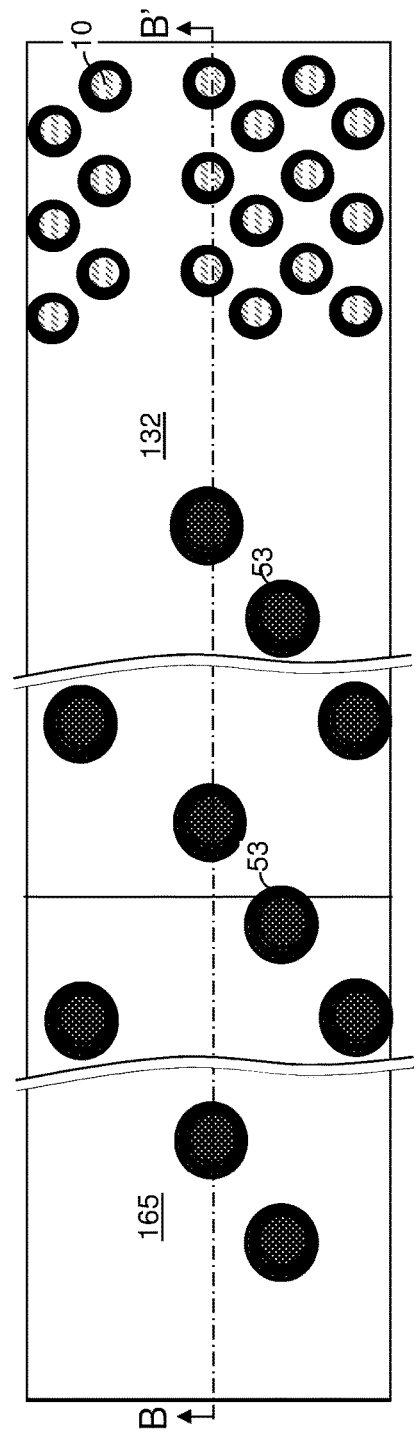
FIG. 7A is a top-down view of the first exemplary structure after removal of the anisotropically deposited patterning film according to the first embodiment of the present disclosure.
Figure 7B:
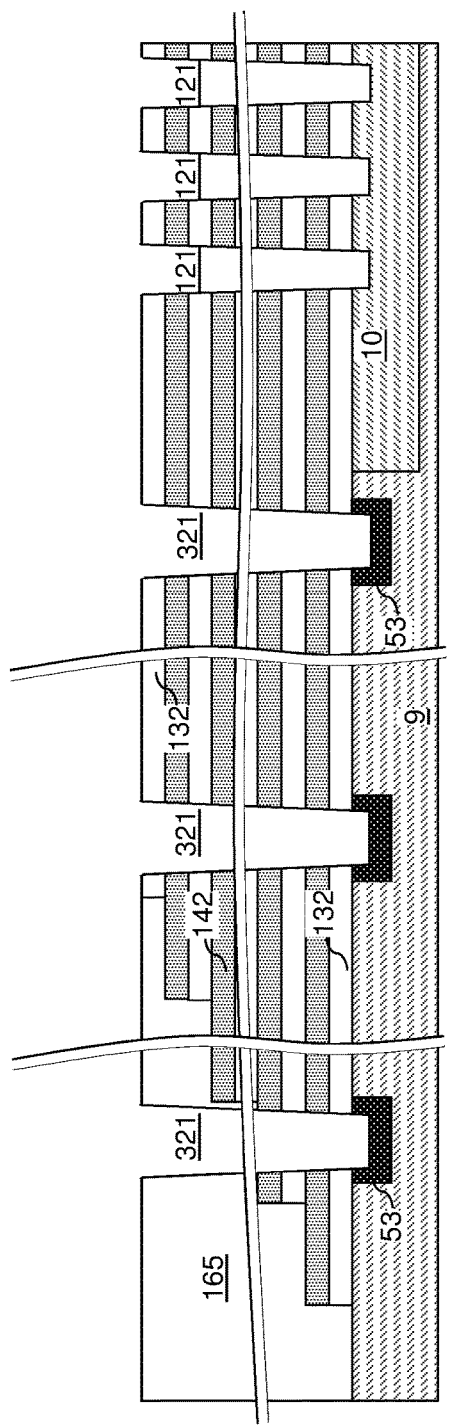
FIG. 7B is a vertical cross-sectional view of the first exemplary structure of FIG. 7A along the vertical plane B-B'.

Referring to FIGS. 7A and 7B, the remaining portions of the patterning film 37 and the photoresist layer 35 can be removed, for example, by ashing. Each first memory opening 121 includes a bottom surface that is a surface of the semiconductor substrate (9, 10), and each first support opening 321 includes a bottom surface that is a surface of a respective impurity-doped semiconductor material portion 53.

Referring to FIGS. 8A and 8B, an epitaxial channel portion 11, such as a single crystal silicon epitaxial channel portion, can be formed by a selective epitaxial growth process at the bottom of each first memory opening 121, while no substantial semiconductor material is deposited in the first support openings 321. In other words, no epitaxial silicon growth occurs in the first support openings 321 on portions 53, or the height of epitaxial silicon grown in the first support openings 321 on portions 53 is at least three times, such as five to twenty five times less than the height of the silicon epitaxial channel portions 11. During the selective epitaxy process, the implanted impurity species prevent growth of a semiconductor material from first portions of the semiconductor substrate (9, 10) (i.e., from the impurity-doped semiconductor material portions 53) in the contact region 200, while the epitaxial channel portions 11 are grown from second portions of the semiconductor substrate (9, 10) (e.g., from the unimplanted portions of the doped semiconductor well 10) in bottom regions of the first memory openings 121. The epitaxial channel portions 11 comprise a single crystalline semiconductor material in epitaxial alignment with the single crystalline substrate semiconductor material of the doped semiconductor well 10. Optionally, the epitaxial channel portions 11 can be doped with electrical dopants of a suitable conductivity type. In one embodiment, the doped semiconductor well 10 and the epitaxial channel portions 11 can have a doping of the first conductivity type (e.g., p-type single crystal silicon in-situ doped with boron).

The selective epitaxy process that forms the epitaxial channel portions 11 can be performed, for example, by sequentially or simultaneously flowing a reactant gas (such as $SiH_4$, $SiH_2Cl_2$, $SiHCl_3$, $SiCl_4$, $Si_2H_6$, $GeH_4$, $Ge_2H_6$, other semiconductor precursor gases, or combinations there) with an etchant gas (such as HCl). The deposition rate of the semiconductor material on amorphous surfaces (such as the surfaces of dielectric materials) or on the surfaces of the impurity-doped semiconductor material portions 53 is less than the etch rate of the semiconductor material by the etchant, while the deposition rate of the semiconductor material on crystalline surfaces (such as the top surface of the semiconductor substrate (9, 10)) is greater than the etch rate of the semiconductor material by the etchant. Thus, the semiconductor material is deposited only on the semiconductor surfaces at the bottom of the first memory openings 121, which are the physically exposed portion of the top surface of the semiconductor substrate (9, 10) in the memory array region 100. The process conditions (such as the deposition temperature, the partial pressure of the various gases in a process chamber, etc.) can be selected such that the deposited semiconductor material is an epitaxial semiconductor material, i.e., single crystalline silicon or another semiconductor material with atomic alignment with the single crystalline structure of the semiconductor substrate (9, 10) (e.g., p-well).

If no additional tier structures are to be formed, then the steps of FIGS. 9A-13B may be omitted. If at least one additional tier structure is to be formed, then referring to FIGS. 9A and 9B, an optional etch stop layer 21 can be formed on the physically exposed surface of the first memory openings 121, the epitaxial channel portions 11, and the first support openings 321, and over the first alternating stack (132, 142). The etch stop layer 21 can include a single dielectric material layer or a plurality of dielectric material layers. The etch stop layer 21 can be deposited on the sidewalls of each memory opening 121 by a conformal deposition method. In one embodiment, the etch stop layer 21 can include silicon oxide or a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the etch stop layer 21 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The etch stop layer 21 can be deposited, for example, by chemical vapor deposition (CVD), atomic layer deposition (ALD), pulsed laser deposition (PLD), liquid source misted chemical deposition, or a combination thereof. The thickness of the etch stop layer 21 can be in a range from 1 nm to 20 nm, although lesser and greater thicknesses can also be employed. The etch stop layer 21 can subsequently function as a dielectric material portion that blocks leakage of stored electrical charges to control gate electrodes. In one embodiment, the etch stop layer 21 includes aluminum oxide.

Additionally or alternatively, the etch stop layer 21 can include a silicon-based dielectric material such as silicon oxide, silicon oxynitride, silicon nitride, or a combination thereof. In one embodiment, the etch stop layer 21 can include silicon oxide. The silicon-based dielectric material can be formed by a conformal deposition method such as low pressure chemical vapor deposition, atomic layer deposition, or a combination thereof. The thickness of the silicon-based dielectric material, if present, can be in a range from 1 nm to 20 nm, although lesser and greater thicknesses can also be employed. Alternatively, the etch stop layer 21 can be omitted, and a blocking dielectric layer can be formed after formation of backside recesses by a conformal deposition process on surfaces of memory films to be subsequently formed.

If at least one additional tier structure is to be formed, then a sacrificial fill material layer is deposited in the cavities of the first memory openings 121 and the first support openings 321, and over the alternating stack (132, 142) and the etch stop layer 21. The sacrificial fill material layer includes a sacrificial fill material, which is a material that can be removed selective to the material of the etch stop layer 21. In one embodiment, the sacrificial fill material can include a semiconductor material such as silicon (e.g., amorphous silicon or polysilicon), germanium, a silicon-germanium alloy. Alternatively, the sacrificial fill material can include amorphous carbon, diamond-like carbon, or a porous organosilicate glass.

In one embodiment, the sacrificial fill material layer can be deposited employing a conformal or a non-conformal deposition process. If a non-conformal deposition process is employed, a cavity can be formed within one or more of the first memory openings 121 and/or the first support openings 321.

A planarization process is performed to remove portions of the sacrificial fill material layer from above an alternating stack (132, 142) of the first insulating layers 132 and the first sacrificial material layers 142. In one embodiment, a chemical mechanical planarization (CMP) process can be employed to remove the sacrificial fill material layer from above the alternating stack (132, 142). Optionally, the horizontal portion of the etch stop layer 21 can be employed as a stopping layer for the CMP process. In one embodiment, the horizontal portion of the etch stop layer 21 can be subsequently removed, for example, by an isotropic etch process or by a touch-up polish process. Alternatively, the horizontal portions of the etch stop layer 21 may remain over the alternating stack (132, 142) after the planarization process.

Each remaining portion of the sacrificial fill material in a first memory opening 121 constitutes a sacrificial memory opening fill portion 31. Each remaining portion of the sacrificial fill material in a first support opening 321 constitutes a sacrificial support opening fill portion 131. In one embodiment, the sacrificial memory opening fill portions 31 can form a two-dimensional array, which may have a periodicity along two different horizontal directions. A vertical portion of the etch stop layer 21 is present directly on sidewalls of the first memory opening 121 and first support openings 321.

Referring to FIGS. 10A and 10B, an optional second alternating stack (232, 242) of material layers is subsequently formed on the top surface of the lower tier structure (132, 142, 165). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers and the fourth material layers can be second insulating layers 232 and second sacrificial material layers 242, respectively. The third material of the second insulating layers 232 can be at least one insulating material. The fourth material of the second sacrificial material layers 242 is a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A dielectric cap layer 70 and a planarization stopping layer 72 can be subsequently formed over the second stack (232, 242). The dielectric cap layer 70 includes a dielectric material that is different from the material of the second sacrificial material layers 242. In one embodiment, the dielectric cap layer 70 can include silicon oxide. The planarization stopping layer 72 is an optional layer, and includes a dielectric material that is different from the material of the second sacrificial material layer 242 and can be employed as a planarization stopping material in a planarization process (which may be a chemical mechanical planarization process). For example, the planarization stopping layer 72 can include silicon nitride and/or a dielectric metal oxide.

Figure 11A:
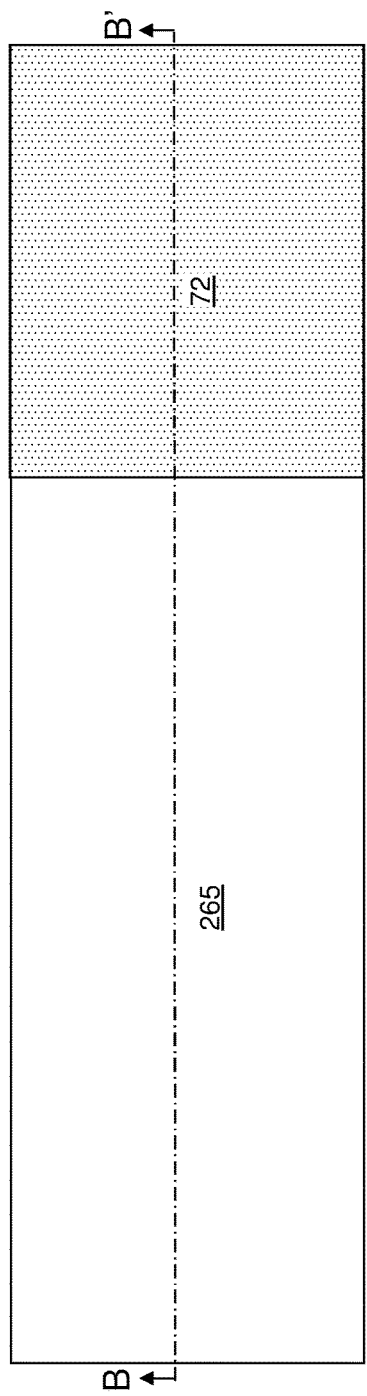
FIG. 11A is a top-down view of the first exemplary structure after formation of second stepped surfaces and a second retro-stepped dielectric material portion according to the first embodiment of the present disclosure.
Figure 11B:
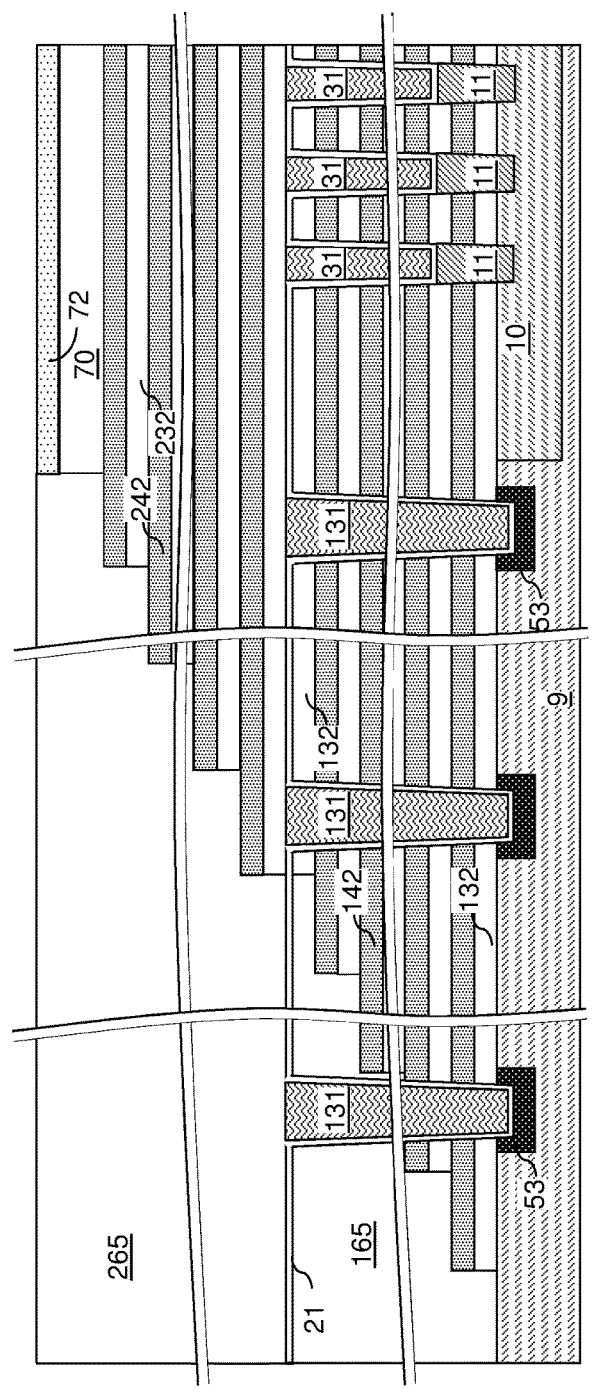
FIG. 11B is a vertical cross-sectional view of the first exemplary structure of FIG. 11A along the vertical plane B-B'.

Referring to FIGS. 11A and 11B, additional stepped surfaces are formed in the second stack (232, 242) in the contact region 200. The additional stepped surfaces are herein referred to as second stepped surfaces. The second stepped surfaces are formed in a second stepped area, which is adjacent to, and does not overlie, the first stepped area of the first stepped surfaces within the lower tier structure (132, 142, 165). The second stepped surfaces can be adjacent to, and do not overlie, the stepped interface between the first alternating stack (132, 142) and the first retro-stepped dielectric material portion 165.

The second stepped surfaces can be formed, for example, by forming a mask layer with an opening therein, etching a cavity within the levels of the topmost second sacrificial material layer 242 and the topmost second insulating layer 232, and iteratively expanding the etched area and vertically recessing the cavity by etching a pair of a second insulating layer 232 and a second sacrificial material layer 242 located directly underneath the bottom surface of the etched cavity within the etched area. The second stack (232, 242) is patterned such that each underlying second sacrificial material layer 242 laterally protrudes farther than any overlying second sacrificial material layer 242 in the etched region, and each underlying second insulating layer 232 laterally protrudes farther than any overlying second insulating layer 232 in the etched region. Thus, within the area of the second stepped terraces, each spacer material layer (such as the second sacrificial dielectric layer 242) laterally extends farther than any overlying spacer material layer within the first alternating stack (232, 242). The etched area includes the area of the contact region 200, which includes the contact area for the second stack (232, 242) and a contact area for the first alternating stack (132, 142).

Thus, the second stack (232, 242) is patterned to form the second stepped surfaces thereupon. The cavity formed by removal of portions of the second stack (232, 242) is herein referred to as a second stepped cavity. The area of the second stepped cavity includes the area of the first retro-stepped first dielectric material portion 165, from which all layers of the second stack (232, 242) are removed. The area of the second stepped cavity further includes the area of the second stepped surfaces of the second stack (232, 242).

Dielectric material is deposited to fill the second stepped cavity. Excess portions of the dielectric material overlying the topmost surface of the second stack (232, 242) are removed, for example, by chemical mechanical planarization. The remaining portion of the deposited dielectric material is retro-stepped, and thus, forms a second retro-stepped dielectric material portion 265. The second retro-stepped dielectric material portion 265 is located on, and over, the second stepped surfaces of the second stack (232, 242). The second retro-stepped dielectric material portion 265 is formed on the second stepped surfaces. The contact region 200 comprises a region of the first stepped surfaces and a region of the second stepped surfaces.

Referring to FIGS. 12A and 12B, second openings (141, 341) are formed through the upper tier structure (232, 242, 265, 70, 72) to the top surface of the lower tier structure (132, 142, 165). The second openings (141, 341) include second memory openings 141 that are formed in the memory array region 100 and second support openings 341 that are formed in the contact region 200. Each second memory opening 141 can be formed in an area that substantially coincides with the area of a respective first memory opening 121, which is substantially the same as a respective sacrificial memory opening fill portion 31. Each second support opening 341 can be formed in an area that substantially coincides with the area of a respective first support opening 321, which is substantially the same as a respective sacrificial support opening fill portion 131.

For example, a lithographic material stack (not shown) including at least a photoresist layer can be formed over the upper tier structure (232, 242, 265, 70, 72), and can be lithographically patterned to form openings within the lithographic material stack. The pattern in the lithographic material stack can be transferred through the entirety of the upper tier structure (232, 242, 265, 70, 72) by at least one anisotropic etch that employs the patterned lithographic material stack as an etch mask. Portions of the upper tier structure (232, 242, 265, 70, 72) underlying the openings in the patterned lithographic material stack are etched to form the second openings (141, 341). In other words, the transfer of the pattern in the patterned lithographic material stack through the upper tier structure (232, 242, 265, 70, 72) forms the second openings (141, 341).

In one embodiment, the chemistry of the anisotropic etch process employed to etch through the materials of the second stack (232, 242) can alternate to optimize etching of the third and fourth materials in the second stack (232, 242) while providing a comparable average etch rate for the second dielectric material portion 265. The anisotropic etch can be, for example, a series of reactive ion etches. The sidewalls of the second openings (141, 341) can be substantially vertical, or can be tapered.

The second memory openings (141, 341) are formed through the upper tier structure (232, 242, 265, 70, 72) in areas overlying the first memory openings (121, 321), which are filled with the sacrificial opening fill structures (31, 24). The second support opening 341 can be formed through the second stack of alternating layers (232, 242) and through the second dielectric material portion 265 concurrently with formation of the second memory openings 141, which are formed through the second stack of alternating layers (232, 242). Preferably, openings 341 are wider than openings 141. In one embodiment, the sacrificial opening fill structures (31, 24) can be employed as an endpoint detection layer to control the termination time of the anisotropic etch process.

The lateral dimensions (e.g., a diameter) of the second openings (141, 341) can be comparable to the lateral dimensions of the first openings (121, 321). For example, the lateral dimensions of the second openings (141, 341) can be from about 20 nm to 200 nm at an upper portion of each second opening (141, 341), and can be about 10 nm to 150 nm at a lower portion of each second opening (141, 341). In one embodiment, the second memory openings 141 and the first memory openings 121 can be formed as an array of openings, which can be a periodic two-dimensional array of openings. The second support openings 341 and the first support openings 321 can be formed as discrete openings that are mutually separated from one another, and may not form a periodic two-dimensional array pattern. The lateral separation distance among the second support openings 341 may be greater than twice (e.g., three time or more) than the nearest neighbor distance among the second memory openings 141.

Each bottom surface of the second memory openings 141 can be entirely within the area of a top surface of an underlying sacrificial memory opening fill portion 31. Each bottom surface of the second support openings 341 can be entirely within the area of a top surface of an underlying sacrificial support opening fill portion 131. Subsequently, the patterned lithographic material stack can be subsequently removed, for example, by ashing.

Referring to FIGS. 13A and 13B, the sacrificial opening fill portions (31, 131) can be removed from below the second openings (141, 341) employing an etch process, which can be an isotropic etch process or an anisotropic etch process. In one embodiment, the etch process can employ an etch chemistry that is selective to the materials of the second alternating stack (232, 242), the planarization stopping layer 72, and the etch stop layer 21. For example, if the sacrificial opening fill portions (31, 131) comprise silicon, the etch process can include a wet etch process employing a KOH solution. Subsequently, physically exposed portions of the etch stop layer 21 can be removed from around each first opening (121, 321) by an etch process that is selective to the materials of the first alternating stack (132, 142), the second alternating stack (232, 242), and the epitaxial channel portions 11.

A stack of a first memory opening 121 in the lower tier structure (132, 146, 165) and a second memory opening 141 in the upper tier structure (232, 246, 265, 70, 72) collectively constitutes an inter-stack memory opening 49, which is a memory opening that extends through multiple tier structures. Each inter-stack memory opening 49 can include a volume of a vertically adjoining pair of a first memory opening 121 and a second memory opening 141, and can extend through the lower tier structure (132, 146, 165) and the upper tier structure (232, 246, 265, 70, 72). A top surface of an epitaxial channel portion 11 can be physically exposed at the bottom of each inter-tier memory opening 49.

A stack of a first support opening 321 in the lower tier structure (132, 146, 165) and a second support opening 341 in the upper tier structure (232, 246, 265, 70, 72) collectively constitutes an inter-stack support opening 149, which is a support opening that extends through multiple tier structures. Each inter-stack support opening 149 can include a volume of a vertically adjoining pair of a first support opening 321 and a second support opening 341, and can extend through the lower tier structure (132, 146, 165) and the upper tier structure (232, 246, 265, 70, 72). A top surface of an impurity-doped semiconductor material portion 53 can be physically exposed at the bottom of each inter-tier support opening 149. Preferably, openings 149 are wider than openings 49.

Referring to FIGS. 14A and 14B, a stack of a memory film 50 and a first semiconductor channel layer 601 can be formed in each of the inter-tier openings (49, 149). Each stack of a memory film 50 and a first semiconductor channel layer 601 can be formed, for example, by sequentially depositing an optional blocking dielectric layer, a charge storage material layer, a tunneling dielectric layer, and a semiconductor material layer, and anisotropically etching horizontal portions of the deposited material layers. The stack of the optional blocking dielectric layer, the charge storage material layer, and the tunneling dielectric layer collectively constitutes a memory film 50. The blocking dielectric layer includes a dielectric material that blocks flow of charge carriers therethrough, and can include a material such as aluminum oxide, silicon oxide, or a combination thereof. The blocking dielectric layer can be formed directly on each impurity-doped semiconductor material portion 53. The charge storage material layer includes charge storage material portions that function as memory elements, and is formed directly on the blocking dielectric layer.

In one embodiment, the charge storage material layer can include a charge trapping material such as silicon nitride. Alternatively, the charge storage material layers can be replaced with floating gate electrodes if recessing of the spacer material layers (142, 242) is performed prior to formation of the blocking dielectric layer, and if a conductive material is deposited within recessed regions and vertically isolated. The tunneling dielectric layer includes a tunneling dielectric such as silicon oxide or an ONO stack. The first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity can be present in each inter-stack opening (49, 149) after formation of the first semiconductor channel layer 601. An anisotropic etch is performed to remove horizontal portions of the first semiconductor channel layer 601 and each memory film 50, and to physically expose a surface of each epitaxial channel portion 11.

Referring to FIGS. 15A and 15B, a second semiconductor channel layer 602 can be deposited on remaining vertical portions of the first semiconductor channel layer 601 and on the physically exposed surfaces of the epitaxial channel portions 11 and the impurity-doped semiconductor material portions 53. The second semiconductor channel layer 602 includes a semiconductor material, which can be any semiconductor material that can be employed for the first semiconductor channel layer 601. The first and second semiconductor channel layers (601, 602) can have a doping of the first conductivity type (i.e., the same conductivity type as the semiconductor substrate (9, 10)) or can be substantially intrinsic. As used herein, a semiconductor material is substantially intrinsic if the dopant concentration does not exceed $1.0 \times 10^{16}/\text{cm}^3$. In one embodiment, the second semiconductor channel layer 602 can include amorphous silicon or polysilicon. The thickness of the second semiconductor channel layer 602 can be in a range from 2 nm to 10 nm, although lesser and greater thicknesses can also be employed.

In case the cavities in the inter-tier openings (49, 149) are not completely filled with the semiconductor channel layers (601, 602), a dielectric core layer can be deposited in the cavities. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Subsequently, the horizontal portion of the dielectric core layer can be removed, for example, by a recess etch from above the top surface of the insulating cap layer 70 and the optional planarization stopping layer 72. For example, the horizontal portion of the second semiconductor channel layer 602 located above the top surface of the planarization stopping layer 72 can be removed by a planarization process, which can employ a recess etch or chemical mechanical planarization (CMP). Each remaining portion of the first and second semiconductor channel layers (601, 602) within the inter-tier openings (49, 149) constitutes a semiconductor channel (601, 602), which is a vertical portion of a composite semiconductor channel that further includes a horizontal semiconductor channel that is present between the epitaxial channel portions 11 and the source regions 61 to be formed in an upper portion of the semiconductor substrate (9, 10).

Electrical current can flow through the semiconductor channel (601, 602) when a vertical NAND device including the semiconductor channel (601, 602) is turned on. A tunneling dielectric 56 is laterally surrounded by a charge storage material layer 54, and laterally surrounds a portion of the semiconductor channel (601, 602). Each memory film 50 can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer can be further recessed within each inter-stack opening (49, 149), for example, by a recess etch to a depth that is located between the top surface of the insulating cap layer 70 and the bottom surface of the insulating cap layer 70. Each remaining portion of the dielectric core layer constitutes a dielectric core 62.

A doped semiconductor material can be deposited in each recessed region over the dielectric cores 62. The doped semiconductor material can be, for example, doped polysilicon. Excess portions of the deposited semiconductor material can be removed from above the top surface of the planarization stopping layer 72, for example, by chemical mechanical planarization (CMP) or a recess etch to form the drain region 63. A drain region 63 can be formed by depositing a doped semiconductor material within each recessed region above the dielectric cores 62 in the inter-stack memory openings 49. Concurrently with formation of the drain regions 62, a dummy drain region 163 can be formed by depositing a doped semiconductor material within each recessed region above the dielectric cores 62 in the inter-stack support openings 149.

A memory stack structure 55 is formed within each inter-stack memory opening 49. A support pillar structure 155 is formed within each inter-stack support opening 149. Each of the memory stack structures 55 and the support pillar structures 155 includes a memory film 50, a vertical semiconductor channel (601, 602), and a dielectric core 62. A drain region 63, which is subsequently electrically contacted by a drain contact via structure, overlies each memory stack structure 55. A dummy drain region 163, which is not electrically contacted by any conductive via structure, overlies each support pillar structure 155.

Each of the memory stack structures 55 and the support pillar structures 155 comprise the same materials, including a respective instance of a layer stack including charge storage material portions (which may be embodied as a continuous charge storage material layer or discrete floating gate structures), a tunneling dielectric layer, and at least one vertically-extending semiconductor layer (such as the semiconductor channel (601, 602)). The memory stack structures 55 can be formed on the epitaxial channel portions 11 simultaneously with formation of the support pillar structures 155 on the impurity-doped semiconductor material portions 53. At least one of the support pillar structures 155 can vertically extend through the retro-stepped dielectric material portions (165, 265) and the stepped terraces therebelow. Thus, each of the memory stack structures 55 can be vertically spaced from the semiconductor substrate (9, 10) by a respective epitaxial channel portion 11. Each of support pillar structures 155 can be in physical contact with an impurity-doped semiconductor material portion 53 within the semiconductor substrate (9, 10).

Figure 16A:
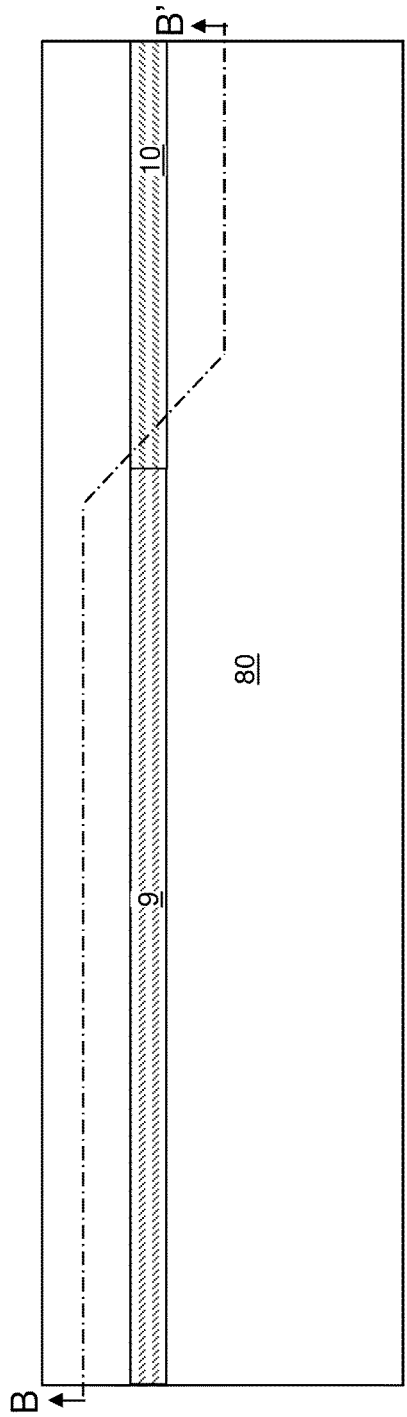
FIG. 16A is a top-down view of the first exemplary structure after formation of backside contact trenches according to the first embodiment of the present disclosure.
Figure 16B:
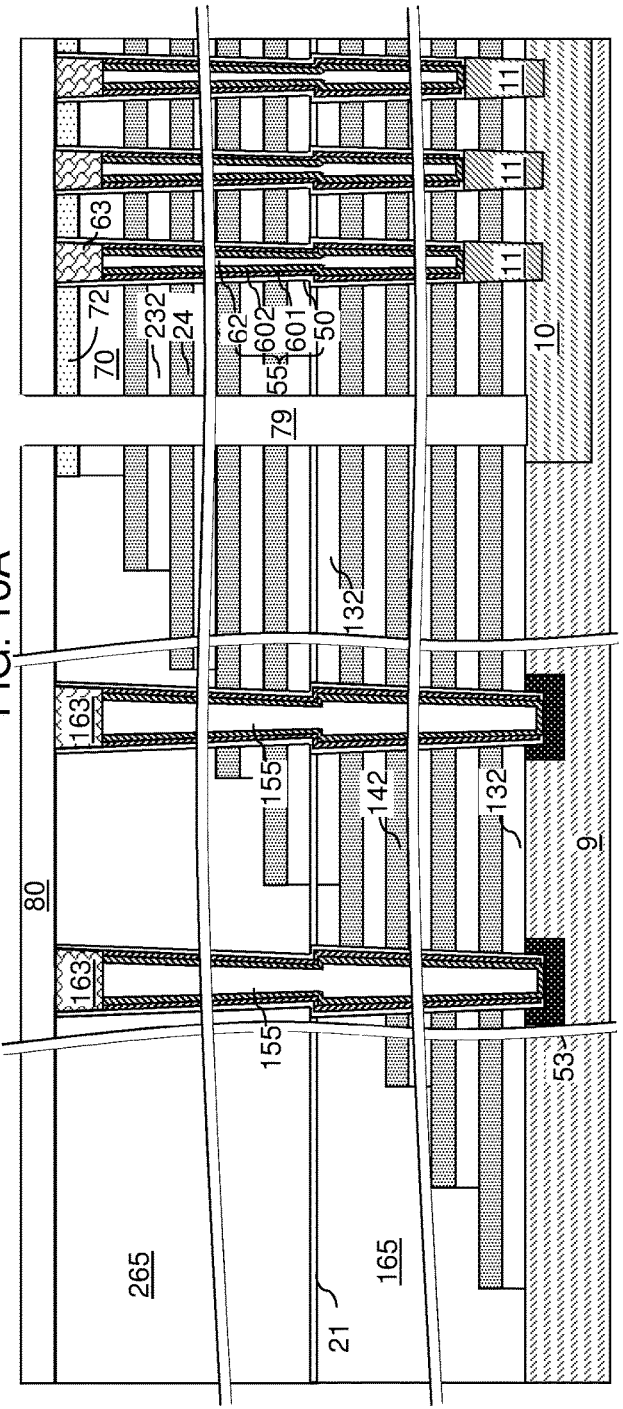
FIG. 16B is a vertical cross-sectional view of the first exemplary structure of FIG. 16A along the vertical plane B-B'.

Referring to FIGS. 16A and 16B, a contact level dielectric layer 80 can be optionally deposited over the upper tier structure (232, 242, 265, 70, 72). The contact level dielectric layer 80 includes a dielectric material that is different from the material of the second sacrificial fill material layers 242. For example, the contact level dielectric layer 80 can include silicon oxide. The thickness of the contact level dielectric layer 80 can be in a range from 20 nm to 500 nm, although lesser and greater thicknesses can also be employed.

At least one contact trench 79 can be formed, for example, by applying a photoresist layer (not shown), lithographically patterning the photoresist layer, and transferring the pattern in the photoresist layer through the upper tier structure (232, 242, 265, 70, 72) and the lower tier structure (132, 142, 165) employing an anisotropic etch. Each contact trench 79 is located in areas that do not overlap with the memory stack structures 55, and this, is referred to as a backside contact trench. The anisotropic etch that forms the at least one contact trench 79 can stop on the semiconductor substrate (9, 10).

Figure 17A:
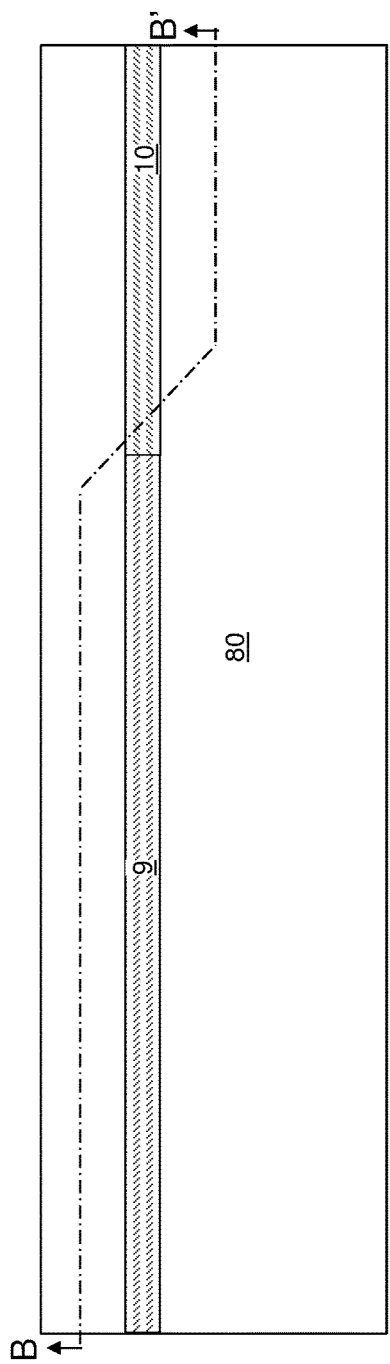
FIG. 17A is a top-down view of the first exemplary structure after formation of backside recesses according to the first embodiment of the present disclosure.
Figure 17B:
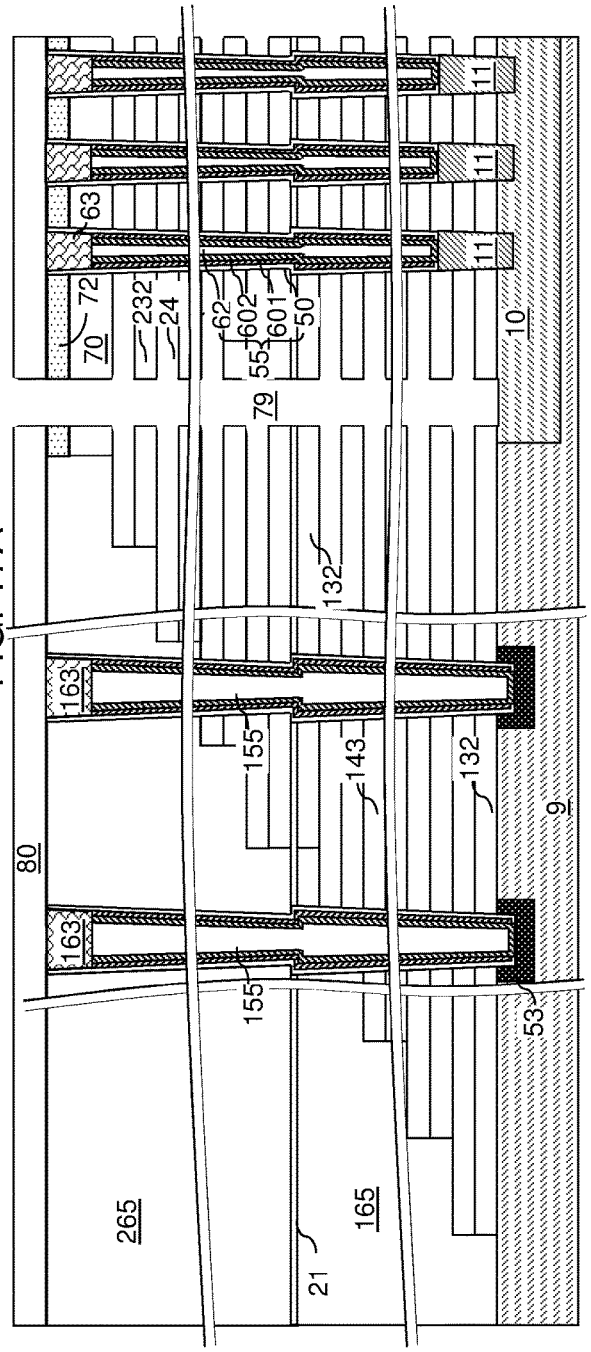
FIG. 17B is a vertical cross-sectional view of the first exemplary structure of FIG. 17A along the vertical plane B-B'.

Referring to FIGS. 17A and 17B, an etchant that selectively etches the materials of the first and second sacrificial material layers (142, 242) with respect to the materials of the first and second insulating layers (132, 232) can be introduced into the contact trench 79, for example, employing an isotropic etch process. First backside recesses 143 are formed in volumes from which the first material layers 142 are removed, and second backside recesses 243 are formed in volumes from which the second sacrificial material layers 242 are removed. The removal of the materials of the first and second sacrificial material layers (142, 242) can be selective to the materials of the first and second insulating layers (132, 232), the materials of the first and second retro-stepped dielectric material portions (165, 265), and the material of the outermost layer of the memory film 50 (which may be a blocking dielectric layer). In one embodiment, the first and second sacrificial material layers (142, 242) can include silicon nitride, and the materials of the first and second insulating layers (132, 232), and the first and second retro-stepped dielectric material portion (165, 265) can be selected from silicon oxide and dielectric metal oxides. In another embodiment, the first and second sacrificial material layers (142, 242) can include a semiconductor material such as germanium or a silicon-germanium alloy, and the materials of the first and second insulating layers (132, 232) and the first and second retro-stepped dielectric material portions (165, 265) can be selected from silicon oxide, silicon nitride, and dielectric metal oxides. The support pillar structures 155 support the insulating layers (132, 232) and prevent them from collapsing into the respective underlying recesses (143, 243).

The isotropic etch process can be a wet etch process employing a wet etch solution, or can be a gas phase (dry) etch process in which the etchant is introduced in a vapor phase into the contact trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each backside recess (143, 243) can be a laterally extending cavity having a lateral dimension that is greater than the vertical extent of the cavity. In other words, the lateral dimension of each backside recess (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the plurality of backside recesses (143, 243) can extend substantially parallel to the top surface of the substrate (9, 10). A first backside recess 143 can be vertically bounded by a top surface of an underlying first insulating layer 132 and a bottom surface of an overlying first insulating layer 132. A second backside recess 243 can be vertically bounded by a top surface of an underlying second insulating layer 232 and a bottom surface of an overlying second insulating layer 232. In one embodiment, each backside recess (143, 243) can have a uniform height throughout. Optionally, a backside blocking dielectric layer can be formed in the backside recesses.

Figure 18A:
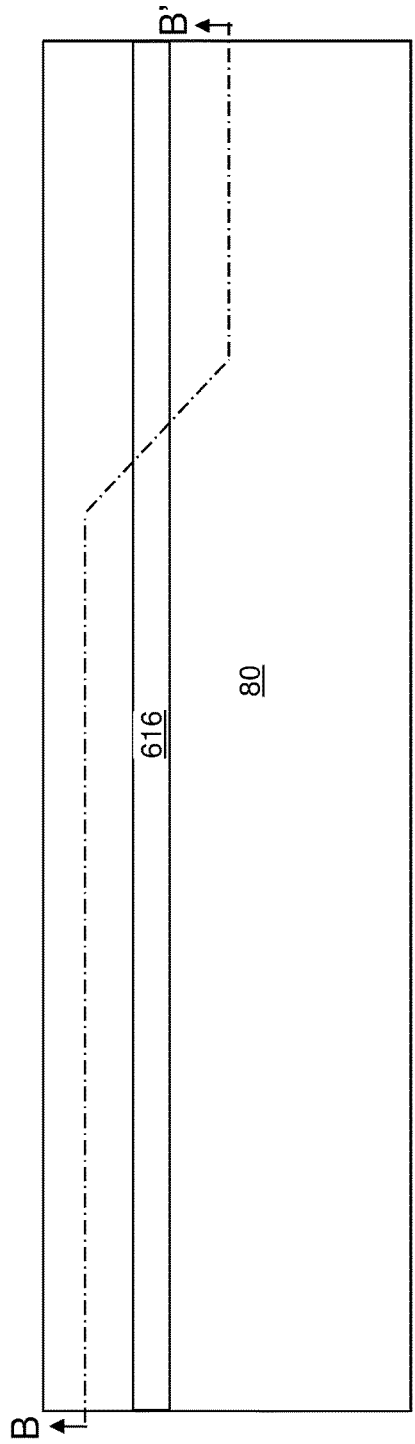
FIG. 18A is a top-down view of the first exemplary structure after formation of annular spacers and a semiconductor oxide portion according to the first embodiment of the present disclosure.
Figure 18B:
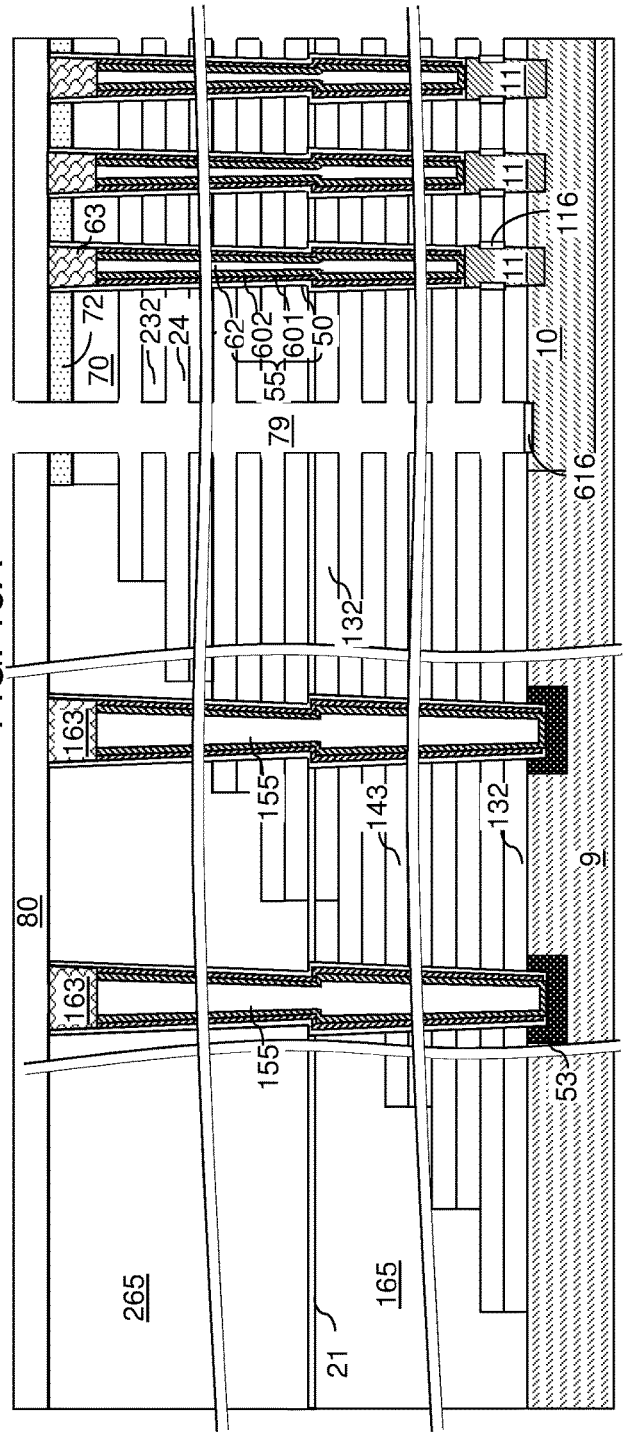
FIG. 18B is a vertical cross-sectional view of the first exemplary structure of FIG. 18A along the vertical plane B-B'.

Referring to FIGS. 18A and 18B, an oxidation process can be performed to convert surface portions of physically exposed semiconductor materials into semiconductor oxide portions. For example, physically exposed surface portions of the epitaxial channel portions 11 can be converted into annular semiconductor oxide spacers 116. A physically exposed surface portion of the semiconductor substrate (9, 10) (such as the surface portion of the doped semiconductor well 10 underlying the contact trench 79) can be converted into semiconductor oxide portions 616.

Figure 19A:
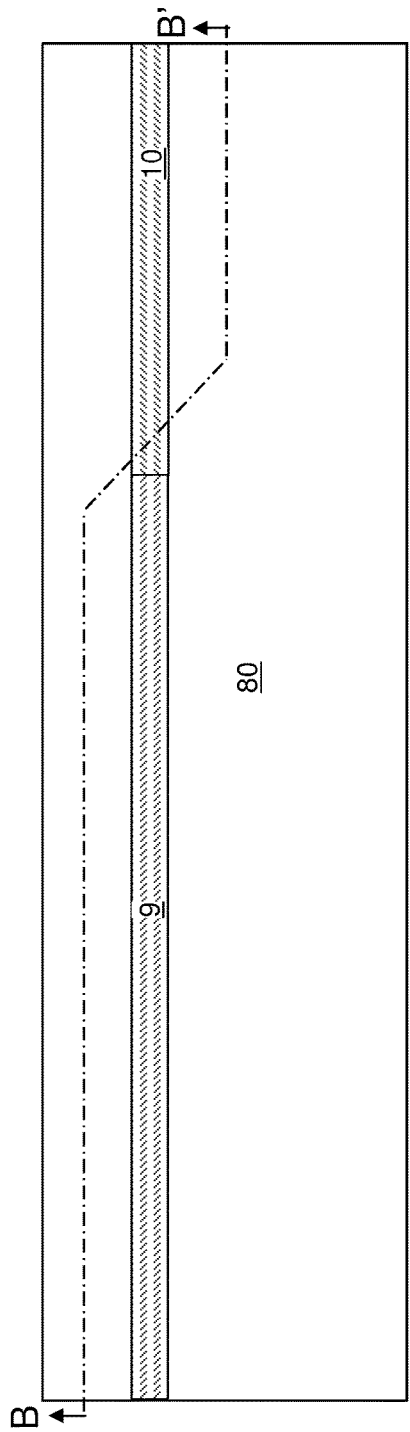
FIG. 19A is a top-down view of the first exemplary structure after formation of electrically conductive layers according to the first embodiment of the present disclosure.
Figure 19B:
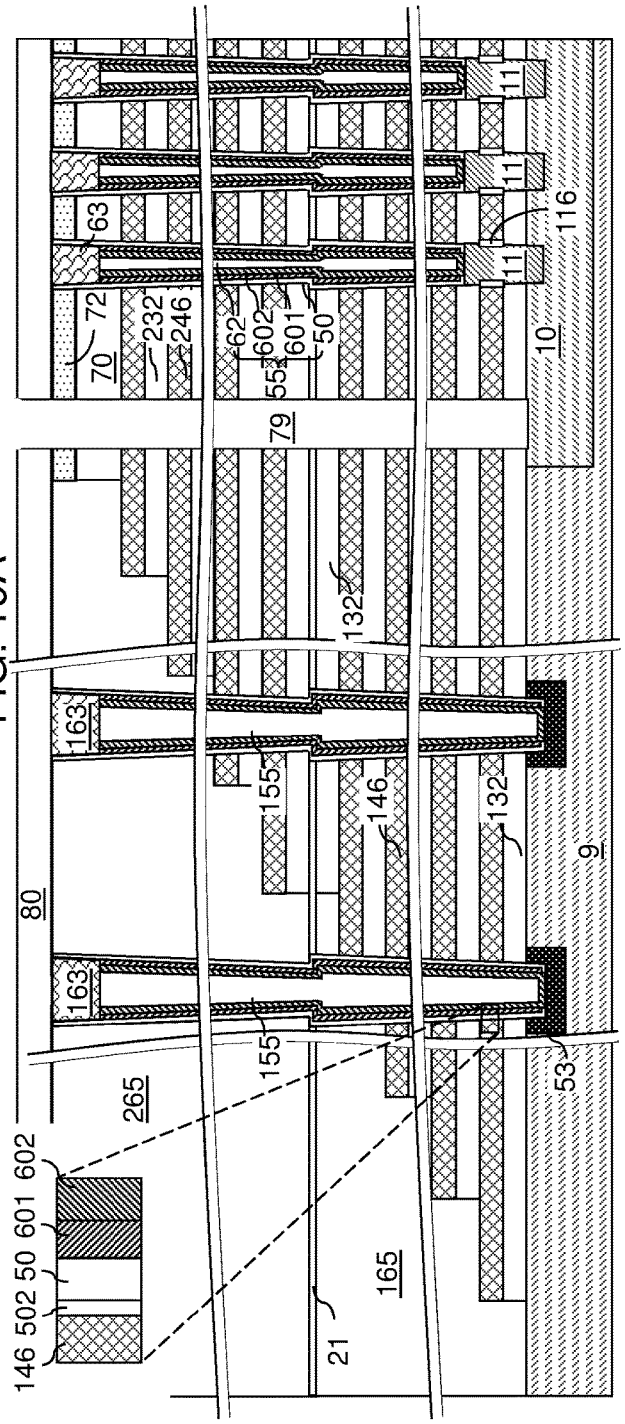
FIG. 19B is a vertical cross-sectional view of the first exemplary structure of FIG. 19A along the vertical plane B-B'.

Referring to FIGS. 19A and 19B, an optional backside blocking dielectric layer 502 can be deposited in the first and second backside recesses (143, 243), on the sidewalls of the contact trench 79, and over the contact level dielectric layer 80 as a continuous dielectric material layer. The backside blocking dielectric layer 502 can include a dielectric material such as aluminum oxide, silicon oxide, or a combination thereof.

At least one conductive material can be deposited in the plurality of backside recesses (143, 243), on the sidewalls of the contact trench 79, and over the contact level dielectric layer 80. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a contiguous metallic material layer (not shown) can be formed on the sidewalls of each contact trench 79 and over the contact level dielectric layer 80. A backside cavity is present in the portion of each contact trench 79 that is not filled with the contiguous metallic material layer. The deposited metallic material of the contiguous metallic material layer can be etched back from the sidewalls of each contact trench 79 and from above the contact level dielectric layer 80, for example, by an isotropic or anisotropic etch.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses (143, 243) can be a combination of titanium nitride layer and a tungsten fill material. In one embodiment, the metallic material can be deposited by chemical vapor deposition or atomic layer deposition.

Thus, each first sacrificial material layer 142 can be replaced with a first electrically conductive layer 146, and each second sacrificial material layer 242 can be replaced with a second electrically conductive layer 246. Each electrically conductive layer (146, 246) can function as a combination of a plurality of control gate electrodes located at a same level and a word line electrically interconnecting, i.e., electrically shorting, the plurality of control gate electrodes located at the same level. A source region 61 of a second conductivity type (e.g., n-type) may be formed in the substrate (9, 10) under the trench 79 by ion implantation of second conductivity type dopants into the substrate through the trench 79.

Figure 20A:
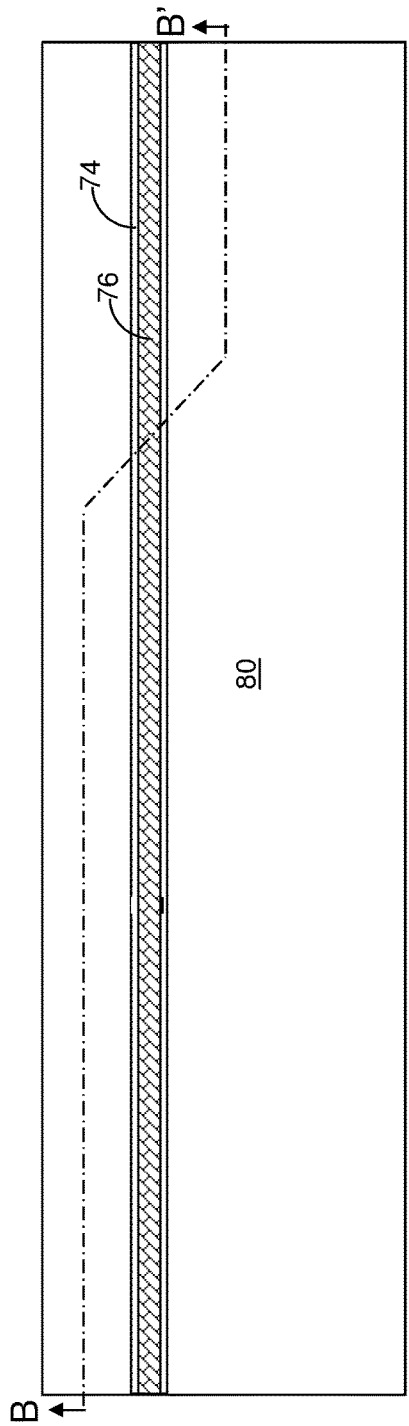
FIG. 20A is a top-down view of the first exemplary structure after formation of an insulating spacer and a backside contact structure according to the first embodiment of the present disclosure.
Figure 20B:
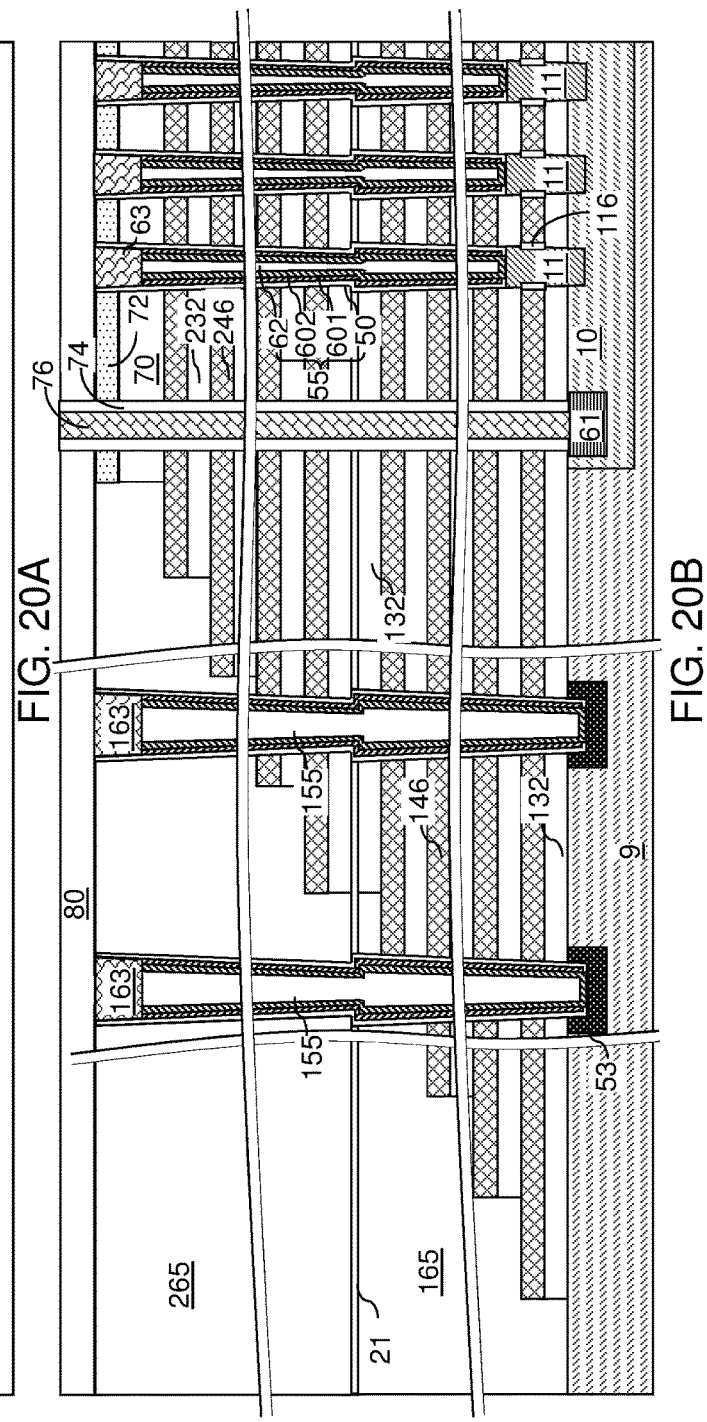
FIG. 20B is a vertical cross-sectional view of the first exemplary structure of FIG. 20A along the vertical plane B-B'.

Referring to FIGS. 20A and 20B, an insulating spacer 74 is formed within each backside contact trench 79 by a conformal deposition of a dielectric material layer and an anisotropic etch that removes the horizontal portions of the dielectric material layer. At least one conductive material is deposited within the cavity enclosed by the insulating spacer 74, and excess portion of the at least one conductive material is removed from above a horizontal plane including a top surface of the contact level dielectric layer 80. A remaining portion of the at least one conductive material within the insulating spacer 74 constitutes a backside contact via structure 76 (e.g., source electrode or local interconnect which contacts the source region 61).

Figure 21A:
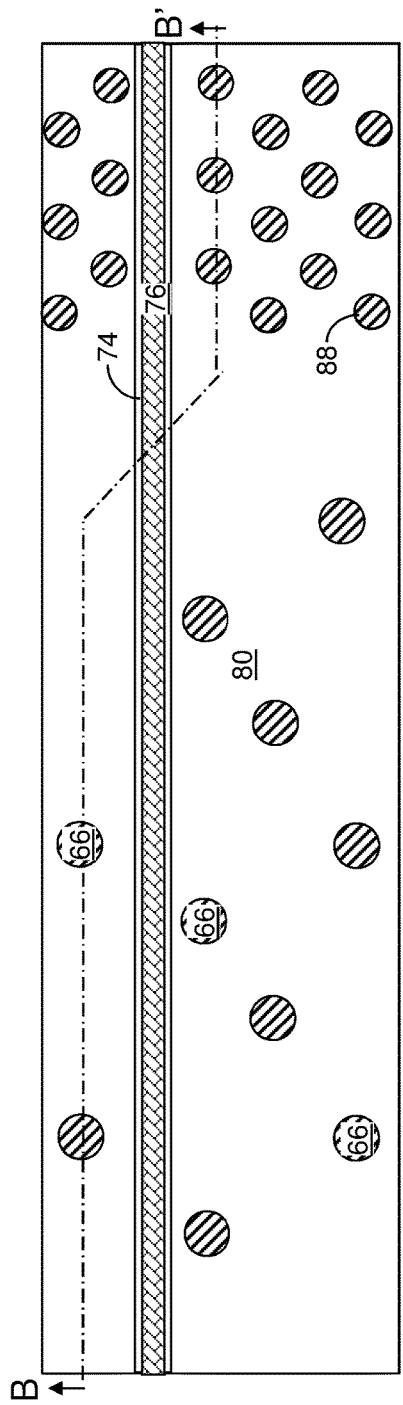
FIG. 21A is a top-down view of the first exemplary structure after formation of various contact via structures according to the first embodiment of the present disclosure.
Figure 21B:
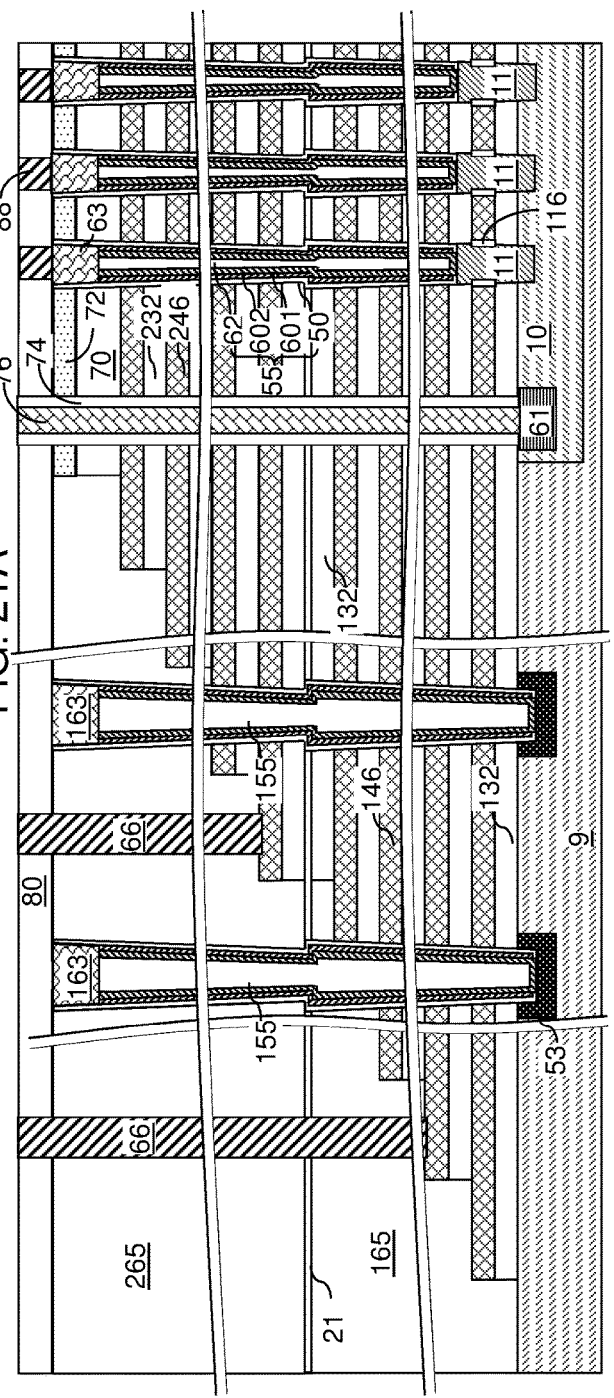
FIG. 21B is a vertical cross-sectional view of the first exemplary structure of FIG. 21A along the vertical plane B-B'.

Referring to FIGS. 21A and 21B, control gate contact via structures 66 can be formed through the contact level dielectric layer 80 and the second and/or first retro-stepped dielectric material portions (165, 265) to provide electrical contact to the first and second electrically conductive layers (146, 246). Array contact via structures 88 can be formed through the contact level dielectric layer 80 to provide electrical contact to the drain regions 63. The array contact via structures 88 electrically contact overlying bit lines (not shown) of the NAND device.

While a method employing two tier structures are illustrated and described above, it should be understood that only one tier or more than two tier structures, such as three to ten tier structures, such as four to six tier structures, may be formed using the above described method. In the above described method, the first stepped terraces, the first memory openings and the first support openings are formed through a first tier structure, the impurity-doped semiconductor material portions are formed underneath the first memory openings, the epitaxial channel portions are formed only in the first memory openings, and the first memory openings and the first support openings are then filled with a sacrificial material. A second tier structure is then formed on the first tier structure. If only two tier structures are used in the memory device, then the method is completed as described above.

If only one tier is used, then the steps of FIGS. 9A to 13B are omitted and the openings 49, 149 and the structures 55, 155 are formed only in the single tier. Alternatively, if more than two tier structures are used in the memory device, then the processing steps for the second tier structure can be modified to fill the second memory openings and second support openings with respective sacrificial fill material portions, and the modified processing steps can be repeated for each tier structure up to the second to last tier structure. Subsequently, the processing steps for forming the second tier structure as described above can be formed for the topmost tier structure with suitable modifications to form inter-tier memory openings and inter-tier support openings that extend through all of the tier structures.

Referring to FIGS. 22A and 22B, a second exemplary structure according to a second embodiment of the present disclosure can be derived from the first exemplary structure of FIGS. 3A and 3B by removing the photoresist layer 35, for example, by ashing, without forming the patterning film 37.

Referring to FIGS. 23A and 23B, a second masking layer, such as a second photoresist layer 135 can be applied over the first tier structure (132, 142, 165), and is lithographically patterned to cover the memory array region 100, while not covering the contact region 200. The second photoresist layer 135 can fill the first memory openings 121 while leaving the first support openings 321 exposed. The ion implantation process of FIGS. 6A and 6B is performed to form impurity-doped semiconductor material regions 53 at the bottom of the first support openings 321. In this case, the patterned second photoresist layer 135 of the second embodiment functions as a patterned masking layer for the ion implantation process in lieu of the combination of the patterning film 37 and the photoresist layer 35 illustrated in FIGS. 6A and 6B. The second photoresist layer 135 is removed, for example, by ashing, and the subsequent processing steps of the first embodiment, beginning with the processing steps of FIGS. 8A and 8B, can be performed to form the exemplary structure illustrated in FIGS. 21A and 21B.

In a third embodiment, the impurity-doped semiconductor material portions 53 may be formed through inter-tier openings 149 after the second tier is formed. Referring to FIGS. 24A and 24B, a third exemplary structure according to a third embodiment of the present disclosure can be derived from the first exemplary structure of FIGS. 3A and 3B by removing the photoresist layer 35 without forming the patterning film 37, and omitting the processing steps of FIGS. 4A, 4B, 5A, 5B, 6A, 6B, 7A, 7B, 8A, and 8B, and performing the processing steps of FIGS. 9A, 9B, 10A, 10B, 11A, and 11B. Thus, formation of the impurity-doped semiconductor material portions 53 and the epitaxial channel portions 11 can be omitted prior to performing the processing steps of FIGS. 9A, 9B, 10A, 10B, 11A, and 11B. In this embodiment, the optional etch stop layer 21 can be formed directly on the surfaces of the semiconductor substrate (9, 10) under the first memory openings 121 and under the first support openings 321.

Referring to FIGS. 25A and 25B, the processing steps of FIGS. 12A, 12B, 13A, and 13B are performed to remove the sacrificial opening fill portions (31, 131) and the portions of the etch stop layer 21 that are located within the first openings (121, 321). Top surfaces of the semiconductor substrate (9, 10) are physically exposed at the bottom of each inter-tier opening (49, 149).

Referring to FIGS. 26A and 26B, the processing sequences of FIGS. 4A, 4B, 5A, 5B, 6A, 6B, 7A, and 7B can be performed with a modification to form the impurity-doped semiconductor material portions 53. The modification is that the patterning film 37 alone is located over layer 72 (i.e. over the second tier) and provides openings over the inter-tier support openings 149 and covers the inter-tier memory openings 49 instead of a combination of a patterning film 37 and a photoresist layer 35 illustrated in FIGS. 6A and 6B. Thus, the ion implantation to form regions 53 is performed into openings 149 with the patterning film 37 located over the second tier covering openings 49.

Alternatively, the processing steps of FIGS. 23A and 23B can be performed in lieu of the processing sequences of FIGS. 4A, 4B, 5A, 5B, 6A, 6B, 7A, and 7B to provide the third exemplary structure of FIGS. 26A and 26B. In this case, the second photoresist layer 135 illustrated in FIGS. 23A and 23B is located over layer 72 (i.e. over the second tier) and is employed as a patterned masking layer that provides openings over the inter-tier support openings 149 and covers the inter-tier memory openings 49. Thus, the ion implantation to form regions 53 is performed into openings 149 with the photoresist 135 located over the second tier covering openings 49.

Once the structure of FIGS. 26A and 26B is formed, a selective epitaxy process of FIGS. 8A and 8B can be performed to form epitaxial channel portions 11 in the inter-tier memory openings 49, while no substantial semiconductor material is deposited in the inter-tier support openings 149 to form the structure illustrated in FIGS. 13A and 13B. Subsequent processing steps of the first embodiment can be performed to form the structure illustrated in FIGS. 21A and 21B.

The various exemplary structures of the present disclosure can include a monolithic three-dimensional memory device that comprises: at least one alternating stack of insulating layers (132, 232) and electrically conductive layers (146, 246) located over a semiconductor substrate (9, 10); memory openings 49 extending through the at least one alternating stack (132, 146, 232, 246), wherein each of the memory openings 49 is filled with an epitaxial channel portion 11 contacting the semiconductor substrate (9, 10) and a memory stack structure 55; and support openings 149 extending through the at least one alternating stack (132, 146, 232, 246), wherein each of the support openings 149 is filled with a support pillar structure 155. Each of the memory stack structures 55 and the support pillar structures 155 comprises an instance of a layer stack including charge storage material portions (such as a charge storage material layer or floating gate structures), a tunneling dielectric layer, and at least one vertically-extending semiconductor layer (601, 602); each instance of the layer stack in the memory stack structures 55 is vertically spaced from the semiconductor substrate (9, 10) by a respective epitaxial channel portion 11; and each instance of the layer stack in the support pillar structures 155 is in physical contact with an impurity-doped semiconductor material portion 53 within the semiconductor substrate (9, 10).

In one embodiment, the impurity-doped semiconductor material portion 53 has a greater concentration of an impurity species than portions 10 of the semiconductor substrate (9, 10) that contacts the epitaxial channel portions 11. In one embodiment, the impurity species can include an element elected from carbon and boron. In one embodiment, the impurity species can be present in the impurity-doped semiconductor material portion is in a range from $5.0 \times 10^{19}/cm^3$ to $5.0 \times 10^{21}/cm^3$. In one embodiment, each of the epitaxial channel portions 11 in the memory openings 49 can be laterally spaced from a bottommost electrically conductive layer 146 in the at least one alternating stack by at least an annular spacer 116. In one embodiment, the annular spacer 116 comprises a dielectric oxide of a semiconductor material in the epitaxial channel portion 11.

In one embodiment, each instance of the layer stack can further comprise a blocking dielectric layer in contact with a charge storage material layer that includes the charge storage material portions, and each impurity-doped semiconductor material portion 53 can contact a respective blocking dielectric layer in the layer stack of the memory film 50. In one embodiment, each impurity-doped semiconductor material portion 53 can contact a respective set of at least one vertically-extending semiconductor layer (601, 602); and each of the epitaxial channel portions 11 contacts a respective blocking dielectric layer and a respective set of at least one vertically-extending semiconductor layer (601, 602). In one embodiment, at least one of the support pillar structures 155 vertically extends through a retro-stepped dielectric material portion (165 or 265) that overlies a stepped terrace of the at least one alternating stack (132, 146, 232, 246) in which each electrically conductive layer (146, 246) laterally extends farther than any overlying electrically conductive layer (146, 246) within the at least one alternating stack (132, 146, 232, 246).

In one embodiment, the monolithic three-dimensional memory device can further comprise a contact level dielectric layer 80 overlying the at least one alternating stack (132, 146, 232, 246); drain regions 63 contacting a respective set of the at least one vertically-extending semiconductor layer (601, 602) in the memory openings 49; and dummy drain regions 163 contacting a respective set of the at least one vertically-extending semiconductor layer (601, 602) in the support openings 149. Each drain region 63 is contacted by an overlying drain contact via structure 88; and the contact level dielectric layer 80 contacts an entire top surface of each of the dummy drain regions 163.

In one embodiment, the monolithic three-dimensional memory structure comprises a monolithic three-dimensional NAND memory device. The first and second electrically conductive layers (146, 246) can comprise, or can be electrically connected to, a respective word line of the monolithic three-dimensional NAND memory device. The substrate (9, 10) can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

By eliminating deposition of a semiconductor material in the support openings, formation of epitaxial channel portions or semiconductor material portions at the bottom of the support openings is avoided. Only dielectric surfaces of the memory film 50 (e.g., of the blocking dielectric layer) are physically exposed to the backside recesses (143, 243) at the bottom of the support openings 149 at the processing step of formation of the annular semiconductor oxide spacers 116 around the epitaxial channel portions 11. Thus, formation of a current leakage path between the lower source select gate electrodes 146 and the semiconductor channel through the epitaxial channel portions in the support openings 149 is avoided by preventing formation of the semiconductor epitaxial channel portions 11 within the support openings 149 at the time formation of the epitaxial channel portions 11 in the memory openings 49.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
    at least one alternating stack of insulating layers and electrically conductive layers located over a semiconductor substrate;
    memory openings extending through the at least one alternating stack, wherein each of the memory openings is filled with an epitaxial channel portion contacting the semiconductor substrate and a memory stack structure; and
    support openings extending through the at least one alternating stack, wherein each of the support openings is filled with a support pillar structure,
    wherein:
    each of the memory stack structures and the support pillar structures comprise an instance of a layer stack including charge storage material portions, a tunneling dielectric layer, and at least one vertical semiconductor layer;
    each instance of the layer stack in the memory stack structures is vertically spaced from the semiconductor substrate by a respective epitaxial channel portion; and
    each instance of the layer stack in the support pillar structures is in physical contact with an impurity-doped semiconductor material portion within the semiconductor substrate.

2. The monolithic three-dimensional memory device of claim 1, wherein the impurity-doped semiconductor material portion has a greater concentration of an impurity species than portions of the semiconductor substrate that contacts the epitaxial channel portions.

3. The monolithic three-dimensional memory device of claim 2, wherein the impurity species comprises an element selected from carbon and boron.

4. The monolithic three-dimensional memory device of claim 2, wherein the impurity species is present in the impurity-doped semiconductor material portion at a concentration in a range from $5.0 \times 10^{19}/cm^3$ to $5.0 \times 10^{21}/cm^3$.

5. The monolithic three-dimensional memory device of claim 1, wherein each of the epitaxial channel portions in the memory openings is laterally spaced from a bottommost electrically conductive layer in the at least one alternating stack by at least an annular dielectric spacer.

6. The monolithic three-dimensional memory device of claim 5, wherein the annular dielectric spacer comprises a dielectric oxide of a semiconductor material in the epitaxial channel portion.

7. The monolithic three-dimensional memory device of claim 1, wherein:
    each instance of the layer stack further comprises a blocking dielectric layer in contact with a charge storage material layer that includes the charge storage material portions; and
    each impurity-doped semiconductor material portion contacts a respective blocking dielectric layer.

8. The monolithic three-dimensional memory device of claim 7, wherein:
    each impurity-doped semiconductor material portion contacts a respective set of at least one vertical semiconductor layer; and
    each of the epitaxial channel portions contacts a respective blocking dielectric layer and a respective set of at least one vertical semiconductor layer.

9. The monolithic three-dimensional memory device of claim 7, wherein at least one of the support pillar structures vertically extends through a retro-stepped dielectric material portion that overlies a stepped terrace of the at least one alternating stack in which each electrically conductive layer laterally extends farther than any overlying electrically conductive layer within the at least one alternating stack.

10. The monolithic three-dimensional memory device of claim 1, further comprising:
    a contact level dielectric layer overlying the at least one alternating stack;
    drain regions contacting a respective set of the at least one vertical semiconductor layer in the memory openings; and
    dummy drain regions contacting a respective set of the at least one vertical semiconductor layer in the support openings,
    wherein:
    each drain region is contacted by an overlying drain contact via structure; and the contact level dielectric layer contacts an entire top surface of each of the dummy drain regions.

11. The monolithic three-dimensional memory device of claim 1, wherein:
the monolithic three-dimensional memory structure comprises a monolithic three-dimensional NAND memory device;
the electrically conductive layers comprise, or are electrically connected to, a respective word line of the monolithic three-dimensional NAND memory device;
the semiconductor substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

12. A method of forming a three-dimensional memory device, comprising:
forming an alternating stack of insulating layers and spacer material layers over a semiconductor substrate;
forming memory openings and support openings through the alternating stack to a top surface of the semiconductor substrate;
implanting an impurity species to first portions of the semiconductor substrate underlying the support openings to form impurity-doped semiconductor material portions, while preventing implantation of the impurity species into second portions of the semiconductor substrate underlying the memory openings;
growing epitaxial channel portions from the second portions of the semiconductor substrate in bottom regions of the memory openings employing a selective deposition process, while no substantial semiconductor material is epitaxially selectively grown from the impurity-doped semiconductor material portions during the selective deposition process; and
simultaneously forming memory stack structures on the epitaxial channel portions and support pillar structures on the impurity-doped semiconductor material portions.

13. The method of claim 12, wherein the impurity species is selected from carbon and boron.

14. The method of claim 12, wherein the impurity species is present in the impurity-doped semiconductor material portion at a concentration in a range from $5.0 \times 10^{19}/cm^3$ to $5.0 \times 10^{21}/cm^3$.

15. The method of claim 12, wherein:
each of the memory stack structures is vertically spaced from the semiconductor substrate by a respective epitaxial channel portion;
no semiconductor material is epitaxially selectively grown from the impurity-doped semiconductor material portions during the selective deposition process; and
each of support pillar structures is in physical contact with an impurity-doped semiconductor material portion within the semiconductor substrate.

16. The method of claim 12, wherein each of the memory stack structures and the support pillar structures have the same materials and comprise a respective instance of a layer stack including charge storage material portions, a tunneling dielectric layer, and at least one vertical semiconductor layer.

17. The method of claim 16, wherein each instance of the layer stack further comprises a blocking dielectric layer in contact with a respective impurity-doped semiconductor material portion and with a charge storage material layer that includes respective charge storage material portions.

18. The method of claim 17, wherein the spacer material layers comprise sacrificial material layers, and the method further comprises:
removing the sacrificial material layers selective to the insulating layers and the blocking dielectric layers; and
converting a surface portion of each of the epitaxial channel portions into an annular spacer including a dielectric oxide of a semiconductor material of the epitaxial channel portions.

19. The method of claim 12, further comprising:
forming a stepped terrace on the alternating stack in which each spacer material layer laterally extends farther than any overlying spacer material layer within the at least one alternating stack; and
forming a retro-stepped dielectric material portion over the stepped terrace of the at least one alternating stack, wherein at least one of the support pillar structures vertically extends through the retro-stepped dielectric material portion and the stepped terrace.

20. The method of claim 12, further comprising:
forming drain regions on the memory stack structures;
forming dummy drain regions on the support pillar structures;
forming a contact dielectric layer over the at least one alternating stack; and
forming drain contact via structures through the contact level dielectric layer and on the drain regions, while not forming any conductive structure directly on the dummy drain regions.

21. The method of claim 12, further comprising:
forming patterned photoresist layer over the alternating stack;
etching the alternating stack using the patterned photoresist layer as a mask to form the memory openings and the support openings; and
forming a patterning film over the patterned photoresist layer using an anisotropic deposition method to seal volumes of the memory openings without sealing volumes of the support openings.

22. The method of claim 21, wherein:
the patterning film comprises a carbon-based film;
the support openings are wider than the memory openings;
the step of implanting the impurity species to the first portions of the semiconductor substrate underlying the support openings comprises implanting the impurity species through openings in the patterning film, through openings in the patterned photoresist layer, and through the support openings; and the patterning film sealing the memory openings prevents implantation of the impurity species into second portions of the semiconductor substrate underlying the memory openings.

23. The method of claim 12, further comprising forming a patterned photoresist layer over the memory openings while exposing the support openings.

24. The method of claim 23, wherein:

the step of implanting the impurity species to the first portions of the semiconductor substrate underlying the support openings comprises implanting the impurity species through the support openings; and the patterned photoresist layer located over the memory openings prevents implantation of the impurity species into second portions of the semiconductor substrate underlying the memory openings.

25. The method of claim 12, wherein:

the monolithic three-dimensional memory structure comprises a monolithic three-dimensional NAND memory device;

the electrically conductive layers comprise, or are electrically connected to, a respective word line of the monolithic three-dimensional NAND memory device;

the semiconductor substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *